United States Patent [19]

Pasch

[11] Patent Number: 5,347,162

[45] Date of Patent: Sep. 13, 1994

[54] PREFORMED PLANAR STRUCTURES EMPLOYING EMBEDDED CONDUCTORS

[75] Inventor: Nicholas F. Pasch, Pacifica, Calif.

[73] Assignee: LSI Logic Corporation, Milpitas, Calif.

[21] Appl. No.: 105,838

[22] Filed: Aug. 12, 1993

Related U.S. Application Data

[63] Continuation-in-part of Ser. No. 981,096, Nov. 24, 1992, which is a continuation of Ser. No. 775,009, Oct. 11, 1991, Pat. No. 5,168,346, which is a continuation of Ser. No. 576,182, Aug. 30, 1990, Pat. No. 5,111,279, which is a continuation of Ser. No. 400,572, Aug. 28, 1989, abandoned.

[51] Int. Cl.$^5$ .................. H01L 23/48; H01L 29/44; H01L 29/52
[52] U.S. Cl. ...................... 257/773; 257/779; 257/780
[58] Field of Search .............. 257/779, 774, 698, 692, 257/772, 738, 773, 780

[56] References Cited

U.S. PATENT DOCUMENTS

| | | | |
|---|---|---|---|
| 3,388,301 | 6/1968 | James | 317/234 |
| 3,429,040 | 2/1969 | Miller | 20/626 |
| 3,624,462 | 11/1971 | Phy | 317/234 R |
| 3,811,186 | 5/1974 | Larnerd et al. | 29/626 |
| 3,835,531 | 9/1974 | Luttmer | 29/625 |
| 3,871,014 | 3/1975 | King et al. | 357/67 |
| 4,190,855 | 2/1980 | Inoue | 357/80 |

(List continued on next page.)

FOREIGN PATENT DOCUMENTS

| | | | |
|---|---|---|---|
| 59996 | 6/1982 | Japan . | |
| 57-210638(A) | 12/1982 | Japan | 21/60 |
| 60-49638(A) | 3/1985 | Japan | 21/60 |
| 61-142750(A) | 6/1986 | Japan | 21/60 |
| 61-145838(A) | 7/1986 | Japan | 21/60 |
| 61-168926(A) | 7/1986 | Japan | H01L 21/58 |
| 61-177753 | 8/1986 | Japan | 257/774 |
| 63-13353 | 1/1988 | Japan | 257/698 |
| 63-52432(A) | 3/1988 | Japan | H01L 21/60 |
| 63-239827(A) | 10/1988 | Japan | 21/60 |
| 63-268418(A) | 11/1988 | Japan . | |
| 1-155633(A) | 6/1989 | Japan | H01L 21/60 |
| 2-96343(A) | 4/1990 | Japan | H01L 21/60 |
| 4-03544(A) | 2/1992 | Japan | H01L 21/60 |
| 4-312933(A) | 11/1992 | Japan | H01L 21/52 |
| WO87/04010 | 7/1987 | PCT Int'l Appl. | H01L 23/48 |

OTHER PUBLICATIONS

"Wafer-Chip Assembly For Large-Scale Integration", by Kraynak et al., IEEE Transactions On Electron Devices, vol. ED 1-5, No. 9, Sep. 1968, pp. 600–603.

*Primary Examiner*—Andrew J. James
*Assistant Examiner*—Donald L. Monin, Jr.
*Attorney, Agent, or Firm*—Gerald E. Linden

[57] ABSTRACT

An interposer (preformed planar structure) is disposed between a die and a substrate (which may be another die). Through holes in the interposer facilitate controlled formation of reflow solder joints between conductive bumps on the die and corresponding conductive bumps of the substrate. In one embodiment, conductive elements embedded in the preformed planar structures extend at least partially into the through holes, forming electrical connections with the corresponding solder joints. The conductive elements can be used to electrically connect one solder joint to another within the interposer, and/or may extend beyond an edge of the interposer to provide for electrical probing of or connection to the solder joints. In one embodiment, the conductive elements are extended outside of the preformed planar structure to form "pins" or leads of the flip-chip structure. In another embodiment, a foil is disposed across a through hole, so that otherwise electro-galvanically incompatible solder balls on the die and the substrate will not corrode each other.

20 Claims, 11 Drawing Sheets

U.S. PATENT DOCUMENTS

| Patent # | Date | Name | Class |
|---|---|---|---|
| 4,355,463 | 10/1982 | Burns | 29/827 |
| 4,425,501 | 1/1984 | Stauffer | 250/216 |
| 4,478,915 | 10/1984 | Poss et al. | 428/607 |
| 4,545,610 | 10/1985 | Lakritz et al. | 29/589 |
| 4,553,036 | 11/1985 | Kawamura et al. | 250/578 |
| 4,636,631 | 1/1987 | Carpentier et al. | 250/216 |
| 4,664,309 | 5/1987 | Allen et al. | 228/180.2 |
| 4,700,276 | 10/1987 | Freyman et al. | 361/403 |
| 4,700,473 | 10/1987 | Freyman et al. | 29/846 |
| 4,733,096 | 3/1988 | Horiguchi | 250/578 |
| 4,783,722 | 11/1988 | Osaki et al. | 361/411 |
| 4,811,082 | 3/1989 | Jacobs et al. | 357/80 |
| 4,825,284 | 4/1989 | Soga et al. | 357/80 |
| 4,827,118 | 5/1989 | Shibata et al. | 250/211 J |
| 4,830,264 | 5/1989 | Bitaillou et al. | 228/180.2 |
| 4,926,241 | 5/1990 | Carey | 357/75 |
| 4,970,575 | 11/1990 | Soga et al. | 357/72 |
| 4,970,577 | 11/1990 | Ogihara et al. | 357/74 |
| 5,006,673 | 4/1991 | Freyman et al. | 174/255 |
| 5,039,628 | 8/1991 | Carey | 437/183 |
| 5,059,553 | 10/1991 | Berndlmaier et al. | 437/183 |
| 5,077,633 | 12/1991 | Freyman et al. | 361/403 |
| 5,111,279 | 5/1992 | Pasch et al. | 357/81 |
| 5,149,958 | 9/1992 | Hallenbeck et al. | 250/216 |
| 5,168,346 | 12/1992 | Pasch et al. | 257/738 |
| 5,258,648 | 11/1993 | Lin | 257/778 |

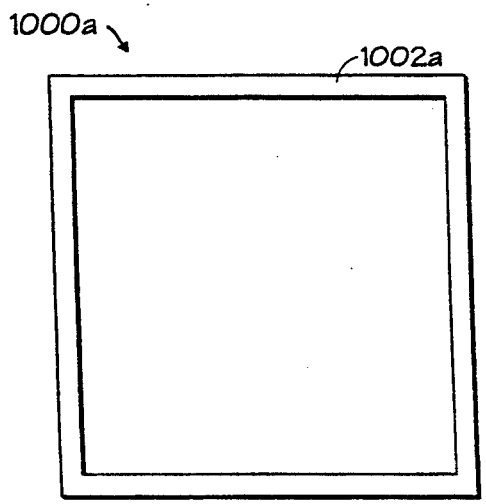
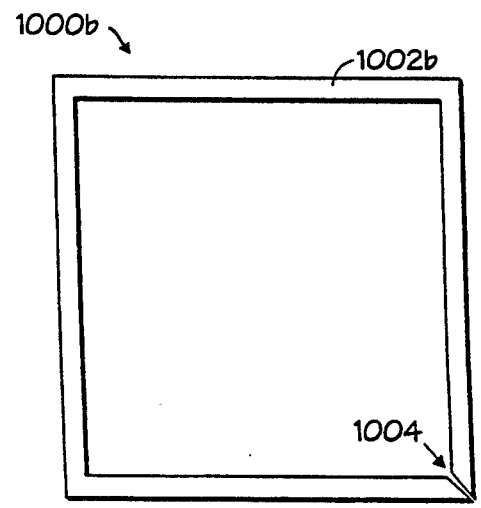
Figure 10a    Figure 10b
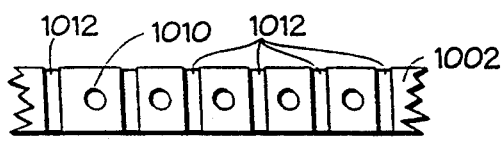
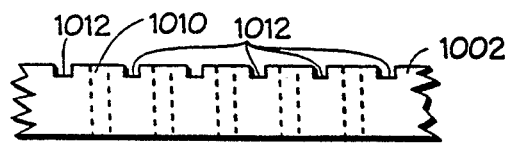
Figure 10c    Figure 10d
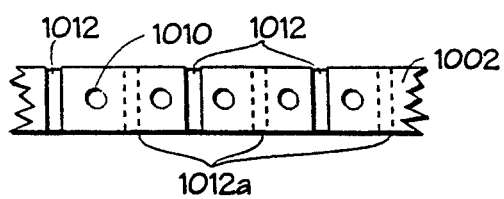
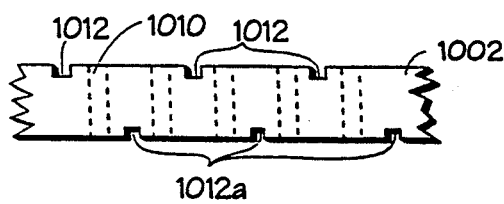
Figure 10e    Figure 10f

PREFORMED PLANAR STRUCTURES EMPLOYING EMBEDDED CONDUCTORS

CROSS-REFERENCE TO RELATED CASES

This is a continuation-in-part of commonly-owned, copending U.S. patent application Ser. No. 07/981,096, filed Nov. 24, 1992 (now pending), which is a continuation of U.S. patent application Ser. No. 07/775,009, filed Oct. 11, 1991 (now U.S. Pat. No. 5,168,346, issued Dec. 1, 1992), which is a continuation of U.S. patent application Ser. No. 07/576,182, filed Aug. 30, 1990 (now U.S. Pat. No. 5,111,279, issued May 5, 1992), which is a continuation of U.S. patent Application Ser. No. 07/400,572, filed Aug. 28, 1989 (now abandoned).

TECHNICAL FIELD OF THE INVENTION

The invention relates to semiconductor "flip-chip" manufacturing techniques and, more particularly, to the fluxing and soldering steps employed in flip-chip manufacture.

BACKGROUND OF THE INVENTION

"Flip-chip" manufacturing techniques involve soldering one or more semiconductor (silicon) chips (one is discussed), in face-to-face relationship, to another semiconductor chip termed a "substrate". Typically, solder balls (otherwise known as pads or bumps) are formed (raised above the planar surface of the chip and substrate) on facing surfaces of both the chip and the substrate at intended points of contact between the two, liquid flux (rosin) is often applied to the face of the chip and/or substrate, the chip is mechanically held in register with the substrate, and the chip and the substrate are subjected to elevated temperature to effect soldering, or fusion of the solder balls on the chip and the corresponding solder balls on the substrate.

The "solder balls" on either the chip or substrate, typically those on the substrate, may be solderable metallized surfaces. The soldering process may be carried out in a reducing atmosphere. A typical flip-chip structure is shown in FIG. 1, and is discussed in greater detail hereinafter.

Previous systems of rigid attachment of chips to chucks have been used for chip alignment, but they must allow some degree of compliance because the chips tend to change relative alignment during soldering by surface tension between the solder balls. The addition of liquid flux to the chip/substrate (flip-chip) assembly creates capillary attraction between the chip and the substrate, which serves to mis-align the chip with respect to the substrate. This is illustrated in FIG. 2, and is discussed in greater detail hereinafter. Further, much of the flux that is applied to the flip-chip assembly is wasted. Still further, the dimension of the remaining gap between the chip and the substrate and the mechanical properties of the solder joints formed by the solder balls and corresponding solder balls tends to be indeterminate.

The present invention is more broadly (i.e., than chip-to-chip) directed to connecting one or more semiconductor "chips" (dies) to one or more "substrates" such as other semiconductor dies, printed circuit (or wiring) boards, and the like. The resulting assembly is termed a "flip-chip structure".

DISCLOSURE OF THE INVENTION

It is therefore an object of the invention to provide a flip-chip manufacturing technique which reduces capillary action, and hence misalignment, between a chip and a substrate.

It is a further object of the invention to provide a flip-chip manufacturing technique which requires the use of less flux, and which controls the position of the flux between the chip and the substrate.

It is a further object of the invention to provide a flip-chip manufacturing technique which provides a controlled spacing between chips and the substrate.

It is a further object of the invention to provide a flip-chip manufacturing technique which provides solder joints having predictable and tailorable mechanical characteristics.

It is a further object of the invention to provide a flip-chip manufacturing technique that simplifies the face-to-face joining of the chip and substrate.

According to the invention, a preformed planar structure is interposed between the chip(s) and the substrate in a flip-chip structure. The preformed planar structure establishes a minimum gap between the chip(s) and the substrate.

According to a feature of the invention, liquid flux is applied to the preformed planar structure in order that flux is selectively applied to the solder balls (pads) on the chip and the substrate.

In an embodiment of the invention, the preformed planar structure is provided with through holes in registration with the solder balls (pads) on the chip(s) and the substrate. In this embodiment, liquid flux selectively fills the through holes for delivery to the solder balls during soldering. The through holes also aid in maintaining registration of the chip(s) and the substrate.

According to an aspect of the invention, the through holes are sized to establish a predetermined mechanical structure of solder joints formed by the solder balls when fused together.

According to an aspect of the invention, the preformed planar structure has a planar core and opposing planar faces. The core is formed of thermosetting organic resin, such as polyimide, or non-organic material such as alumina, polished sapphire, beryllium oxide, aluminum or aluminum nitride. The planar faces of the preformed planar structure are formed of thermoplastic resin or thermosetting material, such as polyacetal, epoxy (epoxy resins) or polystyrene. The preformed planar structure tends to draw the chip(s) together to the substrate, establishing a flip-chip structure or mechanical integrity.

According to an aspect of the invention, the preformed planar structure has a thickness of 5–50 microns, preferably on the order of 20–30 microns.

Additional and further embodiments and variations of a preformed planar structure are set forth below, with respect to the descriptions of FIGS. 6–15.

Other objects, features and advantages of the invention will become apparent in light of the following description thereof.

In the description of further embodiments of a preformed planar structure that follows, the preformed planar structure may alternately be referred to as an "interposer".

Figure 6:
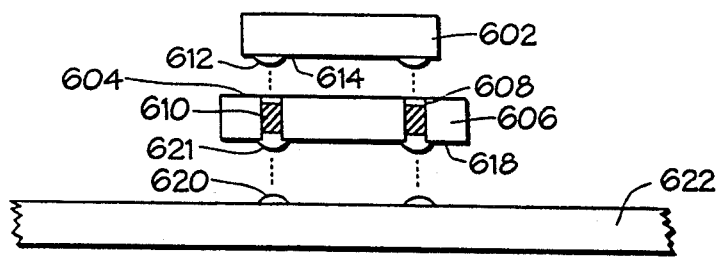

FIG. 6 is an exploded cross-sectional view of a flip-chip assembly incorporating a preformed planar structure (interposer), according to the invention.

Figure 6A:

FIG. 6a is a cross-sectional view of another embodiment of a preformed planar structure, similar to that shown in FIG. 6, according to the invention.

Figure 6B:

FIG. 6b is a cross-sectional view of another embodiment of a preformed planar structure, similar to that shown in FIG. 6a, according to the invention.

Figure 6C:
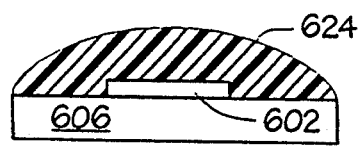

FIG. 6c is a cross-sectional view of an encapsulated semiconductor die assembled to a preformed planar structure, according to the invention.

Figure 7:
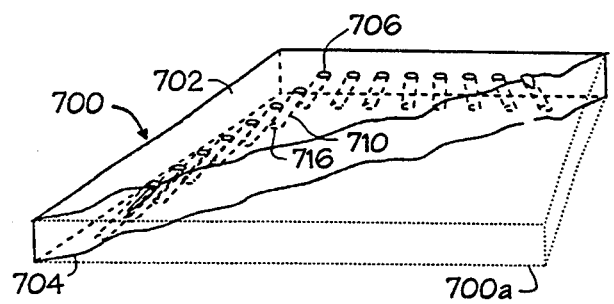

FIG. 7 is a cutaway view of a preformed planar structure including a ring-shaped array of angled through holes, according to the invention.

Figure 7A:
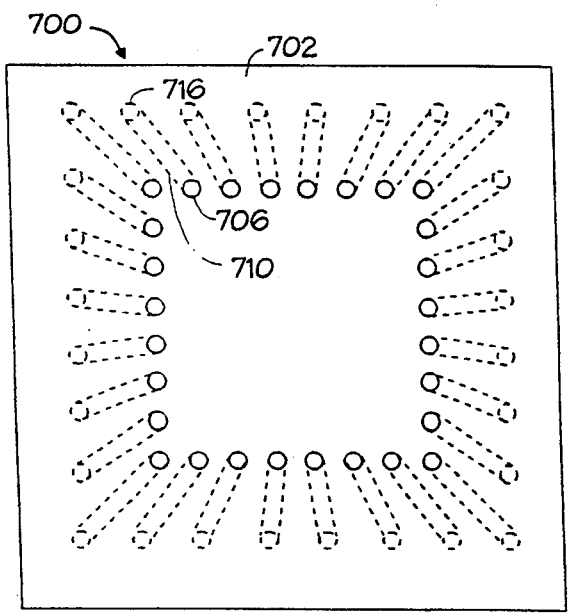

FIG. 7a is a top view of the preformed planar structure of FIG. 7.

Figure 7B:
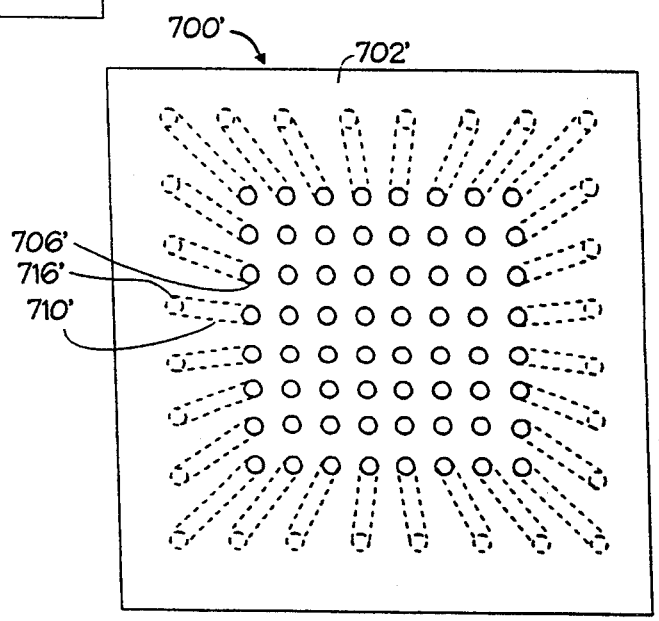

FIG. 7b is a top view of a preformed planar structure with a rectangular array of angled through holes, according to the invention.

Figure 8:
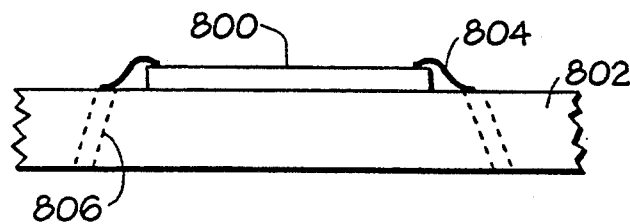

FIG. 8 is a cross-sectional view of a semiconductor device assembly employing a preformed planar structure as a connection "pitch adapter", according to the invention.

Figure 8A:
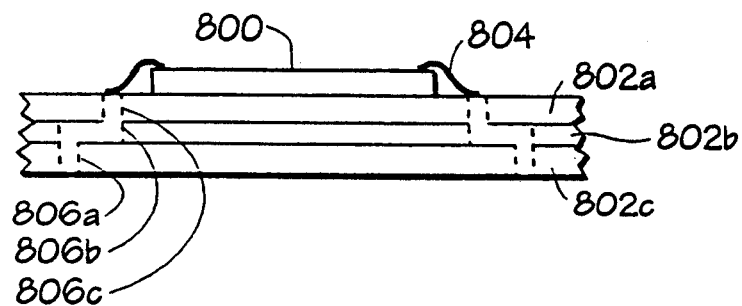

FIG. 8a is a cross-sectional view of a semiconductor device assembly employing a multi-layer preformed planar structure as a connection pitch adapter, according to the invention.

Figure 9A:
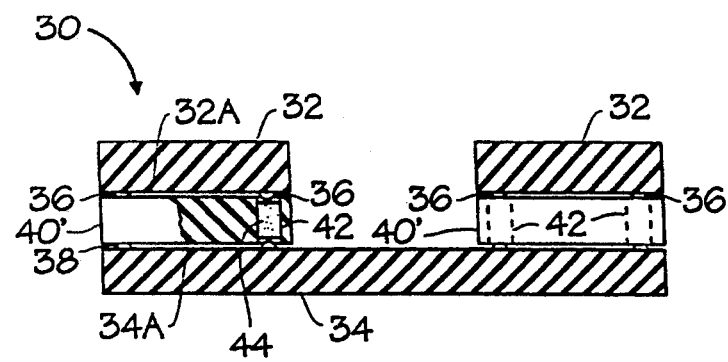

FIG. 9a is a view of a semiconductor device assembly employing dissolvable preformed planar structures, according to the invention.

Figure 9B:
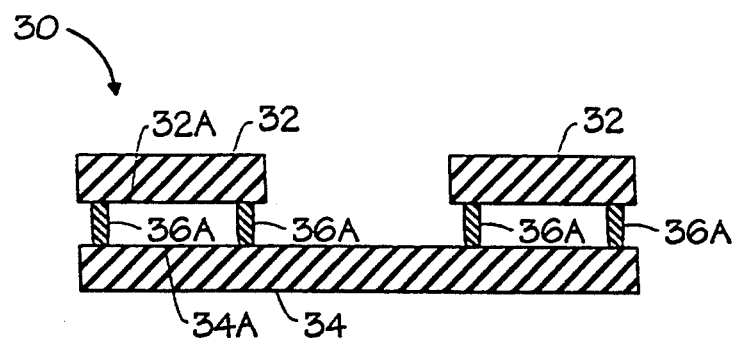

FIG. 9b is a view of a the semiconductor device assembly of FIG. 9a, after dissolving the preformed planar structures.

FIG. 10a is a view of a ring-shaped preformed planar structure, according to the invention.

FIG. 10b is a view of a gapped ring-shaped preformed planar structure, according to the invention.

FIG. 10c is a close-up top view of a portion of a leg of a kerfed ring-shaped preformed planar structure (interposer), according to the invention.

FIG. 10d is a side view of the kerfed interposer of FIG. 10c.

FIG. 10e is a close-up top view of a portion of a leg of another embodiment of a kerfed ring-shaped preformed planar structure (interposer), according to the invention.

FIG. 10f is a side view of the kerfed interposer of FIG. 10e.

Figure 11A:
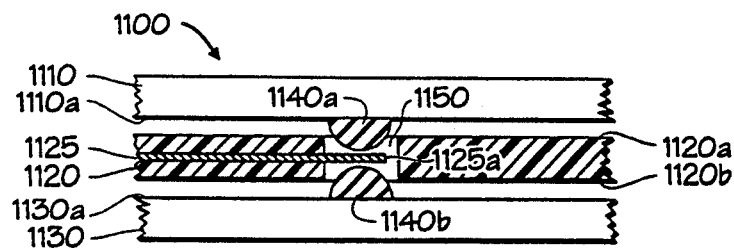

FIG. 11a is a cross-sectional view of a semiconductor device assembly employing a preformed planar structure (interposer) with an embedded conductive trace and probe finger, according to the invention.

Figure 11B:
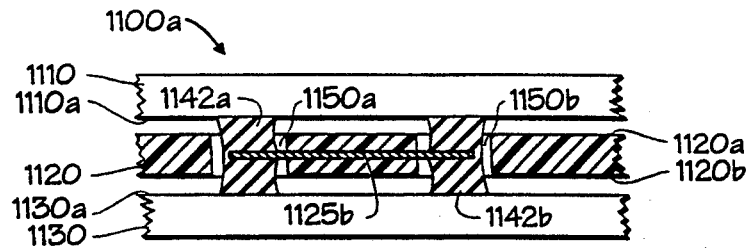

FIG. 11b is a cross-sectional view of a semiconductor device assembly employing a preformed planar structure with an embedded conductive trace electrically connecting two different solder bump connections, according to the invention.

Figure 11C:
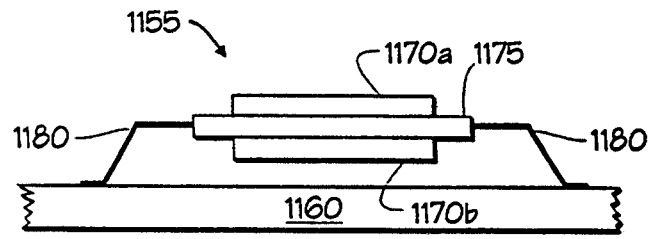

FIG. 11c is a side view of a semiconductor device assembly employing a preformed planar structure (interposer) wherein embedded conductive traces exit the interposer and form conductive leads of the assembly, according to the invention.

Figure 11D:
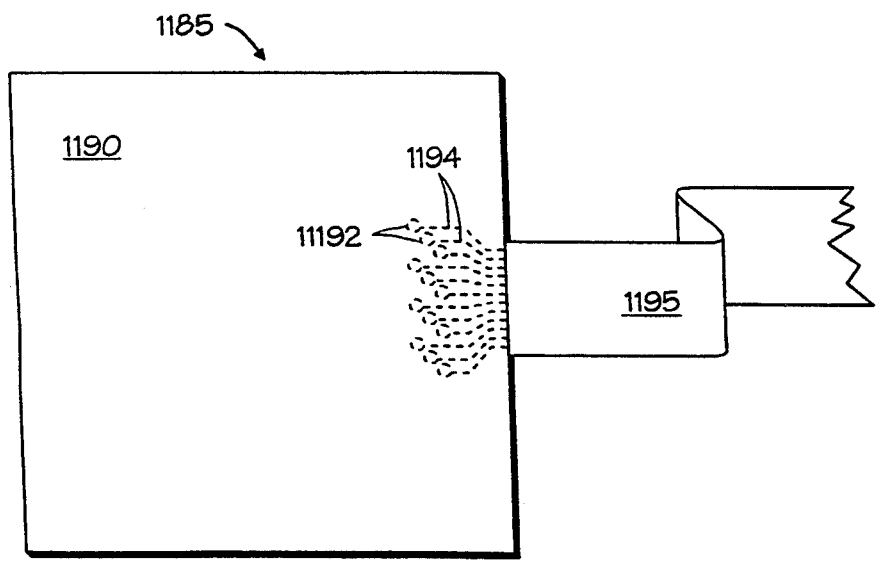

FIG. 11d is a top view of a preformed planar structure (interposer) similar to that of FIG. 11c, wherein conductive leads embedded in the interposer are connected to an external "ribbon-cable", according to the invention.

Figure 12:
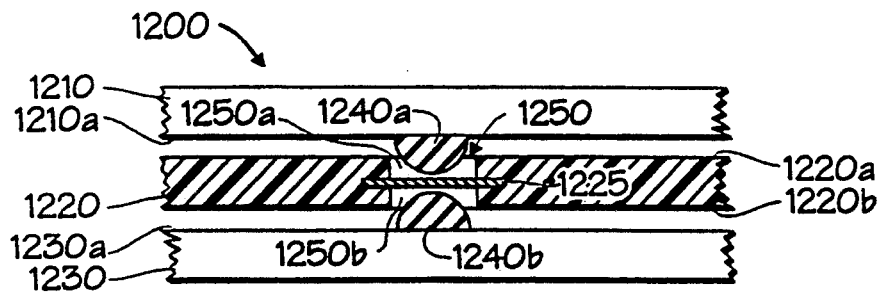

FIG. 12 is a cross-sectional view of a semiconductor device assembly employing noble metal conductors embedded in a preformed planar structure to prevent electro-galvanic corrosion of dissimilar solder bump contacts, according to the invention.

Figure 13A:
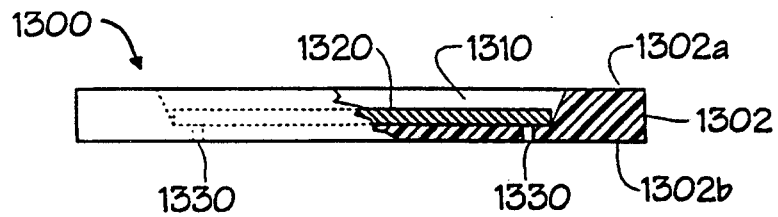

FIG. 13a is a cutaway side view of one embodiment of a stepped preformed planar structure, according to the invention.

Figure 13B:
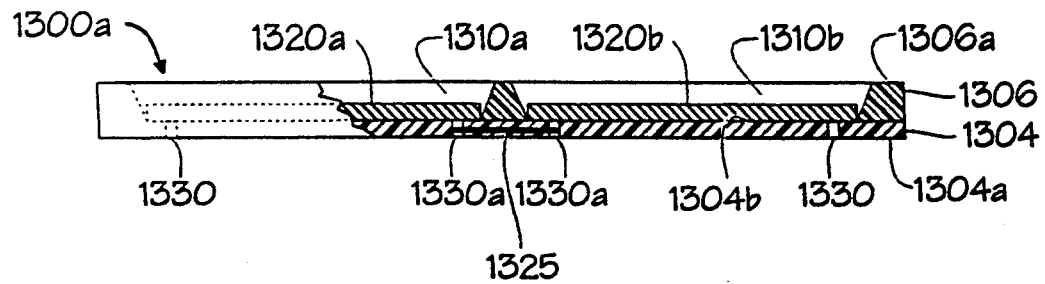

FIG. 13b is a cutaway side view of another embodiment of a stepped preformed planar structure, according to the invention.

FIGS. 14a–d are side views of various embodiments of transparent, colored, clear, and translucent preformed planar structures (interposers) according to the invention.

Figure 15A:
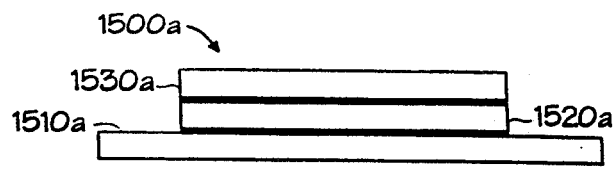

FIG. 15a is a side view of a flip-chip semiconductor device assembly, according to the invention.

Figure 15B:
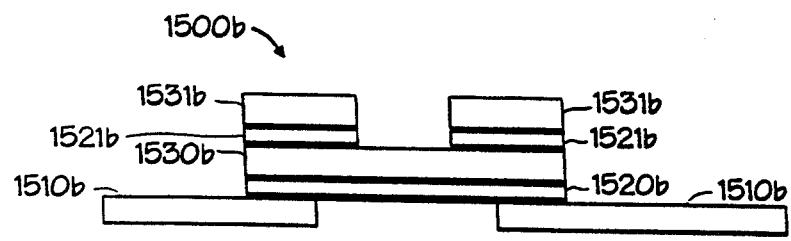

FIG. 15b is a side view of a multi-tier flip-chip semiconductor device assembly, according to the invention.

Figure 15C:
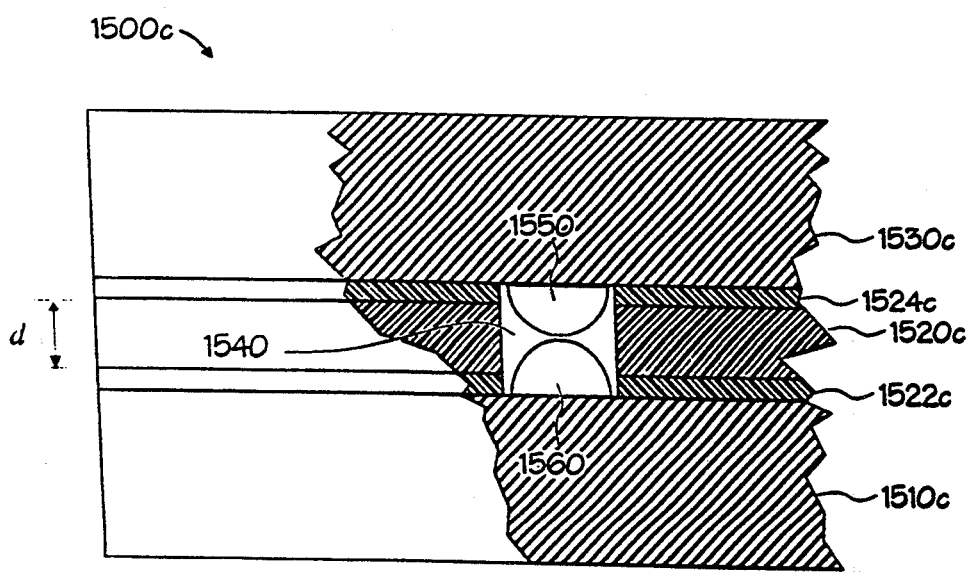

FIG. 15c is a cutaway side view of a flip-chip semiconductor device assembly, according to the invention.

DETAILED DESCRIPTION OF THE INVENTION

Figure 1:
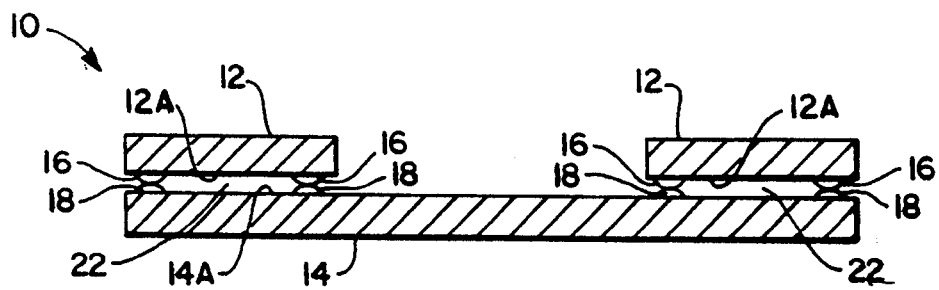
FIG. 1 is a cross-sectional view of a typical, prior art flip-chip structure.
Figure 2:
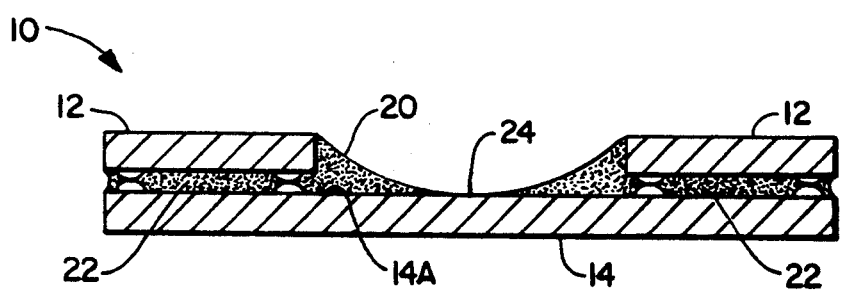
FIG. 2 is a cross-sectional view of a prior art flip-chip assembly illustrating capillary action caused by liquid flux, resulting in the misalignment of a chip with respect to a substrate.

FIGS. 1 and 2 illustrate a prior art technique of assembling flip-chips 10. The completed flip-chip structure 10 includes one or more silicon chips 12 (two of such chips are illustrated) mounted in face-to-face relationship to a larger silicon chip or substrate 14 in the following manner. Solder balls (or pads) 16 are formed on the face 12A of the chip 12, and solder balls (or pads) 18 are formed on the face 14A of the substrate in corresponding positions (i.e., to align with the solder balls 16 of the chips).

It should be understood that the solder balls on either the chip 12 or on the substrate, typically, the corresponding solder balls 18 on the substrate, may simply be solderable metallized surfaces.

It should also be understood that balls (of dollops) of conductive epoxy or polymer could be used in lieu of solder balls. In the main hereinbelow, solder balls are discussed.

Liquid flux 20 (shown in FIG. 2 only) is applied to the face 14A of the substrate, prior to bringing the chips 12 in face-to-face relationship with the substrate 14. The chips 12 are placed in face-to-face relationship by mechanical means, such as with a chuck (not illustrated), and the temperature of the chips and substrate is elevated sufficiently to cause the solder balls 16 on the face 12A of the chips 12 to "fuse", forming solder joints, with the corresponding solder balls 18 on the face 14A of the substrate 14.

As illustrated in FIG. 2, the liquid flux 20 fills a gap 22 between the faces 12A of the chips 12 and the face 14A of the substrate 14, and also fills an area on the face 14A of the substrate 14 between the chips 12. Capillary action and/or surface tension created by the presence of the liquid flux 20 causes the chips 12 to migrate to the center 24 of the substrate 14 during the soldering process, resulting in a lack of registration between the chips 12 and the substrate 14, and hence between the solder balls 16 and the corresponding solder balls 18, respectively. This tendency of the chips to become misaligned during soldering is augmented by any initial lack of planarity between the chips 12 and the substrate 14, and is extremely disadvantageous in the assembly of flip-chips. For instance, it becomes extremely difficult to characterize the mechanical configuration of the solder joints not only because of the difficulty in maintaining accurate registration, but also because of the somewhat unpredictable dimension of the gap 22 between the chips and the substrate. This can adversely affect flip-chip throughput in the manufacturing process. Further, as is evident from FIG. 2, much more flux is used than is required to effect clean solder joints between the solder balls 16 and corresponding solder balls 18, respectively.

Figure 3:
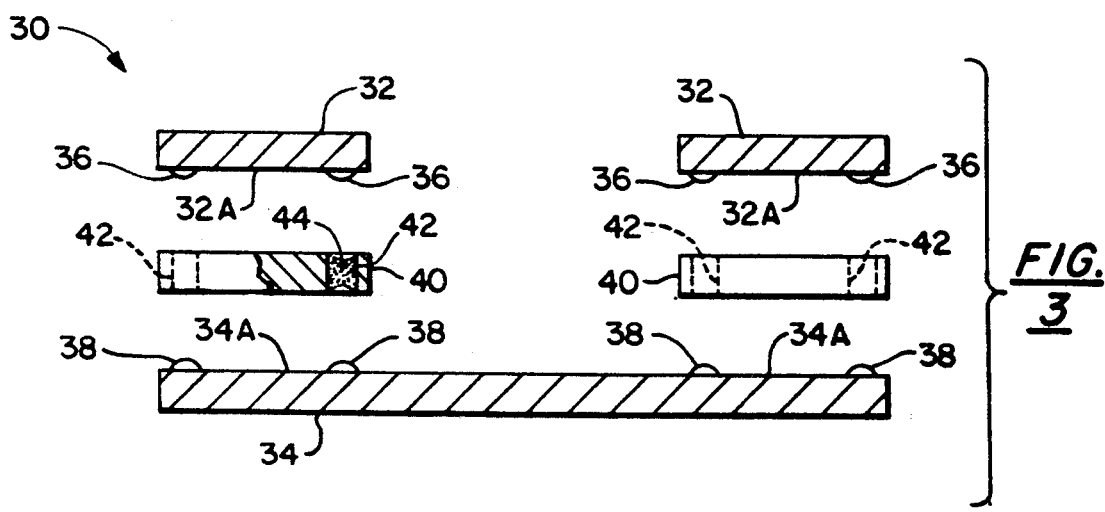
FIG. 3 is an exploded cross-sectional view of a flip-chip assembly, prior to soldering, according to a technique of the invention.

FIG. 3 illustrates a technique of assembling flip-chips 30. In a manner similar to that previously discussed, the flip-chip assembly 30 includes one or more silicon chips 32 (two of such chips are illustrated) ultimately mounted in face-to-face relationship to a larger silicon chip or substrate 14 in the following manner. Solder balls 36 are formed on the face 32A of the chip 32, and solder balls 38 are formed on the face 34A of the substrate 34 in corresponding positions. Notably, liquid flux is not applied to the face 34A of the substrate 34, prior to soldering the chips 32 thereto. Nor is liquid flux required to be applied to the faces 32A of the chips 32.

Prior to soldering the chips 32 to the substrate 34, a preformed planar structure 40 (otherwise termed a "stamp" or "plastic standoff element", and discussed in greater detail hereinafter), of similar planar dimension as the chip 32, is interposed between the chips 32 and the substrate 34. The planar structure 40 is provided with through holes 42 in positions corresponding to the positions of the solder balls 26 and 38, respectively. Inasmuch as the solder balls 36 are typically located just within the perimeter of the chips 32, the through holes 42 would be located just within the perimeter of the planar structure 40.

Prior to soldering, the planar structure 40 is dipped (not illustrated) into a solution (bath) of liquid flux, such as rosin material, and is allowed to dry, as shown at 44. In this manner, the planar structure 40 receives selectively deposited rosin preferentially within the holes 42, in registration with the corresponding solder balls 32 and 34, and there will be very little, if any, flux on the planar surface of the preformed planar structure. The capillary action of liquid solutions in small holes draws the bulk of the liquid flux material into the through holes 42, which are disposed in register with the solder balls, to effect successful solder bonding.

This selective application of flux to the solder balls has numerous advantages: there will be very little flux on the surfaces of the planar structure; a minimum amount of rosin is used to flux the solder balls; extra (waste) flux is kept out of the flip-chip assembly; and relative motion of the chips otherwise caused by the capillary action and/or surface tension of such excess molten flux will be minimized.

By successive dilution of the flux bath into which the planar structure is dipped, an optimal amount of flux can be empirically determined for particular applications that will both successfully flux the solder balls and minimize flux usage, and the aforementioned problems inherent therein.

Thus, the chips 32 are more easily and accurately held in place by mechanical means, such as with a chuck (not illustrated) during soldering, resulting in increased throughput (yield) of flip-chips in the manufacturing process. Further, the holes 42 in the planar structure 40 assist in maintaining registration of the solder balls 36 and corresponding solder balls 38, respectively, and hence alignment of the chips 32 with respect to the substrate 34.

Figure 4:
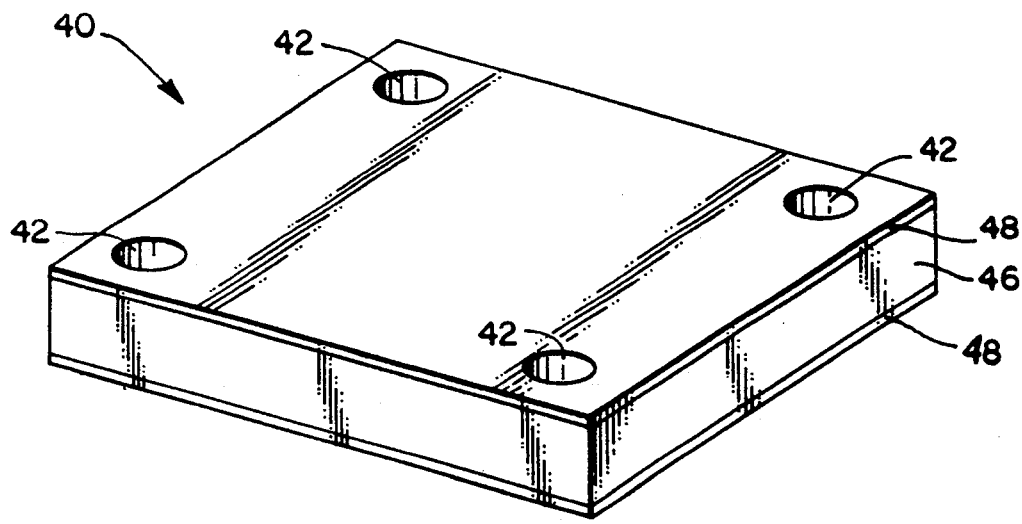
FIG. 4 is a perspective view of a plastic standoff element (preformed planar structure) employed in the technique of FIG. 3.

FIG. 4 shows, in further detail, the preformed planar structure 40 used in the technique of FIG. 3. References to FIG. 3 are made in the following paragraphs.

The preformed planar structure 40 includes a planar core 46 formed of a material such as thermosetting organic resin or non-organic material (e.g. aluminum sheet, alumina sheet, beryllium oxide sheet). Laminated to both opposing faces of the core 46 are planar layers (faces) 48 formed of thermoplastic (resin) or thermosetting "skin" which can be expected to soften significantly at the elevated temperatures employed for solder reflow in the flip-chip bonding process. This softening and consequent shrinking of the thermoplastic resin skin (and hence shrinkage of the overall planar structure) will allow and encourage the chips to draw or grow closer to the substrate in response to surface tension caused by the molten solder balls and surface tension of the skin itself. This "growing together" of the chips and substrate, in other words diminution of the gap therebetween, is desirable to ensure that each and every solder ball has an opportunity to grow together and successfully fuse. Again, this enhances flip-chip throughput (yield) in the manufacturing process. It is also important to regulate the amount of growing together in that the requirements for solder ball shape may require a planar structure which does not generate a structure of minimum surface area.

The thermoplastic faces 48 will re-solidify after soldering (upon reduction in temperature) and create a cushion for the faces 32A and 34A of the chips 32 and substrate 34, respectively. Simultaneously, the shrinkage of the planar structure 40, especially the thermoplastic faces 48 thereof, will have the effect of drawing the chips together as they cool off to room temperature after soldering. In this manner, the solder balls are mechanically kept in contact with the chips and substrate, respectively, as well as with each other.

The core 46 of the preformed planar structure exhibits good thermal conductivity, and is formed of a rigid thermosetting organic resin or non-organic material, such as polyimide, polished alumina, polished sapphire, beryllium oxide, aluminum/or aluminum nitride. A suitable polyimide is available from CIBA-GEIGY Corporation, Santa Clara, Calif., in their Probimide (TM) 300 or 400 Series, or Selectilux (TM) HTR 3, microelectronic materials. The faces 48 of the preformed planar structure 40 are formed of a thermoplastic material such as polyacetal, epoxides or polystyrene. It is advantageous that the preformed planar structure exhibit hermeticity and that it does not wick the liquid flux. The overall thickness of the preformed planar structure 40 is on the order of 5–50 microns, preferably 30–30 microns, and the preformed planar structure acts as a physical barrier standoff between the chips and the substrate.

A synergistic effect results from the use of the preformed planar structure which effectively eliminates flux from the faces of the chips and substrate by selectively causing the flux to be deposited on the solder balls and corresponding solder balls, respectively. Inasmuch as the faces of the chips and substrates are relatively clean, any adhesion of the planar structure (notably the "skin") thereto effects a mechanical connection of the solder balls and corresponding solder balls irrespective of soldering. (Albeit; the adhesion and shrinkage become effective at the elevated temperature experienced during soldering). This satisfies the adage that, "good mechanical joints lead to good solder joints".

The preformed planar structure 40 serves as a plastic standoff element to determine the size of the gap between the chips and the substrate. Evidently, the relatively solid core 46 of the planar structure 40 sets a relatively rigid lower limit on the amount that the chips can grow (draw) together to the substrate as the solder balls and corresponding solder balls melt and fuse together.

As mentioned hereinbefore, in prior art flip-chip manufacturing techniques the mechanical properties of the solder joints remain somewhat indeterminate. By use of the planar structure 40 in the manufacturing process, flip-chip structures can be formed without the usual concerns about solder ball bond rigidity. Evidently, the through holes 42 form a generally cylindrical "mold" of predetermined dimension wherein the solder joints are formed. One may view the resulting solder joint formed therein by the solder balls and corresponding solder balls as a mechanical structure (not illustrated) or predetermined dimension, and calculate the resulting mechanical properties thereof, such as rigidity (or elasticity), shear strength, tensile strength, bending moment, etc.

Figure 5:
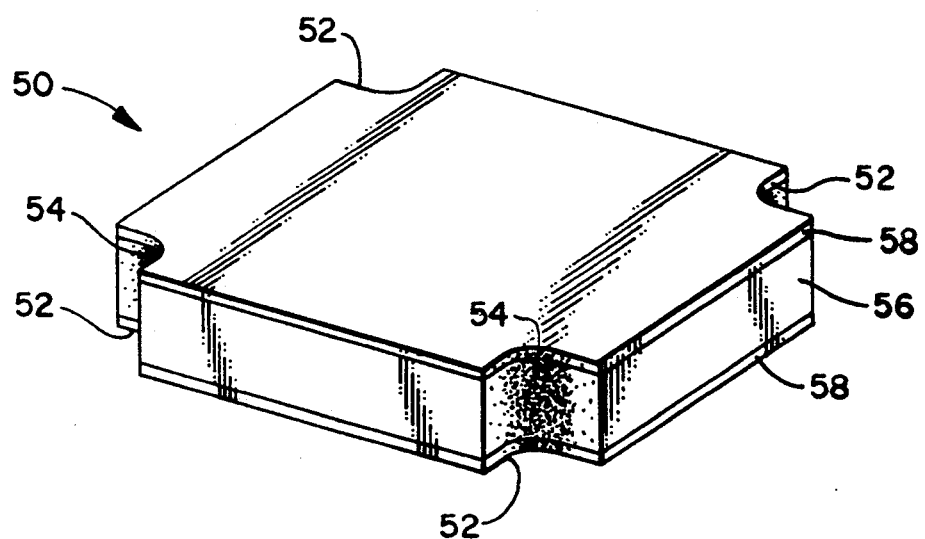
FIG. 5 is a perspective view of an alternate embodiment of a standoff element suitable to be employed in the technique of FIG. 3.

FIG. 5 is a perspective view of an alternate embodiment of a preformed planar structure, or standoff element 50, suitable to be employed in the technique of FIG. 3. References to FIG. 3 are made in the following paragraphs.

With respect to the materials used to form the core 56 and faces 58, and the thickness thereof, the standoff element 50 is similar to the standoff element 40 shown in FIG. 4. However, rather than having through holes 42 in alignment with the solder balls 32 and corresponding solder balls 34, the standoff element 50 may be provided with corner cutouts 52 in alignment with the solder balls 32 and corresponding solder balls 34, and is sufficiently sized so that the solder joints are formed just outside its perimeter. The surfaces of the corner cutouts 52 can be left relatively rough (as compared with the faces 58) in order that liquid flux 54 tends to adhere thereto (as opposed to draining off the faces 58). As discussed with respect to the planar structure 40, the liquid flux is applied to the planar structure 50 by dipping the planar structure in a bath of liquid flux which is allowed to dry thereon. Under the elevated temperatures employed for solder bonding, the flux will be delivered to the solder balls 32 and to the corresponding solder balls 34.

The advantages of the standoff element (preformed planar structure) 50 are similar to those of the standoff element 40 with respect to forming a gap of predetermined dimension between the chip and the substrate, aiding in drawing together the chip and the substrate, mechanically drawing together the solder balls and the corresponding solder balls, requiring less flux to effect soldering and, to a lesser extent aiding in maintaining alignment of the chip and the substrate and alleviating the usual concerns about solder ball bond rigidity.

The preformed planar (layered) structure cushions and draws and holds (upon re-solidifying) the chip and the substrate together in the flip-chip manufacturing process. This improves the mechanical integrity of the flip-chip assembly and increased the resistance thereof to loss of electrical contact between the solder balls. This is important in that the solder balls themselves serve as the mechanical point of attachment between the chip and the substrate. Chip (to substrate) draw together is controlled, and a permanent tension is created between the chip and substrate.

The invention solves the problem of using too much flux and having the position of the chips change during bonding (soldering). The invention allows the use of an absolute minimum of flux so subsequent cleaning of the flip-chip assembly is simplified.

SUMMARY OF PARENT CASES

The aforementioned commonly-owned parent U.S. patent application Ser. Nos. 07/981,096, 07/775,009 (U.S. Pat. No. 5,168,346), U.S. patent application Ser. No. 07/576,182 (U.S. Pat. No. 5,111,279) and U.S. patent application Ser. No. 07/400,572 describe a preformed planar structure which is suitable to be interposed between a semiconductor die and a substrate. In one embodiment, the preformed planar structure is provided with through holes, that are ultimately filled with a conductive material. Furthermore, the preformed planar structure may be formed as a multi-layer structure having a planar core and opposing planar faces. The core may be formed of thermosetting organic resin, such as polyimide, or of non-organic material such as alumina, polished sapphire, beryllium oxide, aluminum nitride or aluminum. The planar faces of the preformed planar structure may be formed of thermoplastic resin or thermosetting material, such as polyacetal, epoxide resin or polystyrene. Methods of mounting a chip (e.g., semiconductor die) to a substrate (e.g., another semiconductor die), using the preformed planar structure are discussed.

Generally, as described in parent, commonly-owned U.S. Pat. Nos. 5,111,279 and 5,168,346, the preformed planar structures serve at least two purposes: (1) the through holes or cutouts allow for selective fluxing and ensure predictable mechanical characteristics of joints formed by solder balls, and (2) the preformed planar structure provides a prescribed standoff (separation) between the chip and the substrate, and also helps draw them together in intimate contact with the preformed planar structure.

In the discussion that follows, the preformed planar structure is often referred to as an "interposer", especially in those cases where it is literally interposed between a chip and a substrate. Further, in the discussion that follows, it should be understood that the substrate could be a printed circuit board, another chip or chips, or the like. It should further be understood that the chip could be a complete packaged semiconductor device.

Use of the preformed planar structure as a pitch-spreader

The preformed planar structures of commonly-owned parent U.S. Pat. Nos. 5,111,279 and 5,168,346 generally disclose an interposer (preformed planar structure) for forming solder joints between a chip and a substrate having the same pitch, or spacing, of solder bumps. Generally, the through holes or cut outs extended perpendicularly through the preformed planar structure.

It is an object of the present invention to provide a preformed planar structure suitable for interposing between, and aiding in joining together, a chip having an array (pattern) of solder bumps at one pitch (spacing from one another) and a substrate having an array of solder bumps disposed at another, dissimilar pitch.

It is an object of the invention to provide an improved technique for packaging semiconductor dies, and for interconnecting the packaged dies to external systems.

According to the invention, one face of a preformed planar structure (interposer) is provided with an array of holes disposed at one pitch (spacing) for aligning with the solder bumps of a chip, and the other face of the preformed planar structure is provided with an array of holes at another pitch for aligning with solder bumps on a substrate. Angled or bent through holes through the preformed planar structure extend from the one holes to the other holes, and may be partially or fully filled with a conductive material prior to assembling the chip to the substrate.

According to the invention, a preformed planar structure is interposed between at least one die and an underlying substrate. (The underlying substrate being part of an external system, such as a printed circuit board). The preformed planar structure is provided with at least one through hole. At least one electrical connection is made from the at least one die, through the at least one through hole to connection points on the underlying substrate.

In one embodiment of the invention, the die is flipped face-down onto a face of the preformed planar structure, and solder balls on the face of the die align with the through holes on the face of the preformed planar structure. Circuit elements may be formed on the face (obverse) or back (reverse) side of the die. Typically, the circuit elements would be formed on the face of the die.

According to an aspect of the invention, the (at least one) through holes in the preformed planar structure are pre-filled, or partially pre-filled, with conductive material, such as metal, solder, or conductive polymer or epoxy, such as silver-filled epoxy.

According to a feature of the invention, the reverse (opposite the die) side of the preformed planar structure is provided with ball bumps, or the like, for making connections from external systems (via the underlying substrate) to the die. In this case, the preformed planar structure forms a significant part of the package body surrounding and/or supporting the die.

According to a feature of the invention, the through holes are partially pre-filled with conductive material, and are then pre-fluxed for subsequent attachment of the die and formation of the ball bumps.

According to an aspect of the invention, the through holes are disposed at various angles through the preformed planar structure so that they have a first, relatively close spacing on the face of the preformed planar structure receiving the die (for making connections to an array of closely-spaced solder bumps on the face of the die), and have a second, relatively far-apart spacing on the face of the preformed planar structure making connection to external systems. The connection to external systems would typically be achieved by means of a printed circuit board (PCB) which would have connection points disposed at a greater pitch than the solder bumps on the die.

According to another embodiment of the invention, at least one die is mounted to a preformed planar structure having at least one through hole. At least one connection to the die is made through the at least one through hole. Additional connections to the die are made on the side of the die facing away from the preformed planar structure, such as by wire bonding.

According to an aspect of either embodiment of the invention, the preformed planar structure has a planar core and opposing planar faces. The core is formed of thermosetting organic resin, such as polyimide, or non-organic material such as alumina, polished sapphire, beryllium oxide, aluminum or aluminum nitride. The planar faces of the preformed planar structure are formed of thermoplastic resin or thermosetting material, such as polyacetal, epoxy (epoxide resins) or polystyrene.

Other objects, features and advantages of the invention will become apparent in light of the following description thereof.

FIG. 6 shows (exploded) a die 602 flipped onto a face 604 of a preformed planar structure 606. The preformed planar structure 606 is similar to the previously described structures (see, e.g., the structure described as 40, FIG. 3), but the through holes 608 (compare with through holes 42, FIG. 3) are at least partially filled with a conductive material 610. For example, the conductive material 610 is recessed below the die-side 604 of the preformed planar structure. In this manner, conductive balls (raised conductive bumps) 612 disposed on the face 614 of the die will partially enter the recesses 616 formed in the top surface 604 of the preformed planar structure 606. Additionally, because the conductive material is recessed, flux can be selectively applied to the preformed planar structure, depositing itself exclusively in the recesses, in a manner similar to that set forth with respect to the preformed planar structure 40 (FIG. 3).

The conductive material 610 may be metal, which will fuse with the balls 612, which may be formed of solder. In this manner, a solder joint of predetermined mechanical structure is formed in the recess, similar to what has been described above with respect to FIGS. 3–5.

Alternatively, the conductive material may be a conductive polymer, and the balls 612 may also be formed of a conductive polymer, in which case there will be an adhesion between the balls 612 and the conductive material 610.

It is within the scope of this invention that the conductive material 610 is not recessed below the surface 604 of the preformed planar structure, but is flush with same, as shown in FIG. 6a, or extends slightly above the surface of same, as shown in FIG. 6b.

In a similar manner, the conductive material 610 may extend only partially to the opposite surface 618 of the preformed planar structure 606, as shown in FIG. 6, and the resulting recesses can be pre-fluxed in a manner similar to that described with respect to the preformed planar structure 40 (FIG. 3). The recesses formed by the partially-filled through holes will allow self-registration of conductive balls (raised conductive bumps) 620 on the surface of an underlying substrate 622 to self-self align with the preformed planar structure (with die mounted thereto). The underlying substrate is, for example, a printed circuit board with wire traces (not shown), and electrically connects the die to external components or systems (not shown).

As shown in FIG. 6, solder balls 621 may be formed on the bottom surface of the preformed planar structure.

As shown in FIG. 6c, the preformed planar structure 606 is preferably larger than the die 602, and the die, once joined to the preformed planar structure, can be encapsulated with epoxy 624, or the like. In this manner, the preformed planar structure 606 forms part of a package body enclosing the die. The epoxy 624 forms the remainder of the package body. The preformed planar structure of FIG. 6c would preferably be provided with solder balls such as those shown in FIG. 6 at 621.

The preformed planar structure 606 is preferably thicker than the previously described preformed planar structures (e.g., 40, 50, FIG. 3), and preferably will provide adequate structural support for the die, especially when used in the manner set forth with respect to FIG. 6c. Additionally, a thicker (e.g., than that of FIG. 3) preformed planar structure may be used as a "pitch adapter" for connecting conductive bumps (612) of the die, at a relatively fine pitch, to conductive bumps (620) of an underlying substrate at a relatively coarse pitch.

FIG. 7 shows a cutaway portion of a relatively thick preformed planar structure (interposer) 700 having one surface 702 upon which a die (not shown) will be mounted, and an opposite surface 704 which will be mounted to an underlying substrate (not shown). (The remaining outline of the preformed planar structure 700 is shown in dashed lines 700a.) The preformed planar structure 700 is similar to that described with respect to FIGS. 6, 6a–6c, with the exception that the through holes 710 are arranged at a range of angles with respect to the surfaces 702, 704, such that at least some of the openings (e.g., 716) of the through holes 710 in the bottom surface 704 are not directly under (i.e., are offset from) corresponding openings (e.g., 706) in the top surface 702 of the interposer 700. In the preformed planar structures described hereinabove (40, 606), the through holes were generally all disposed at ninety degrees ("normal") to the surfaces of the preformed planar structure, such that the bottom openings of the through holes were located generally directly beneath the corresponding top openings.

By angling the through holes 704, at a range of angles, the through holes can be made to exit the one surface 702 of the preformed planar structure 700 at one spacing ("pitch"), for example in a linear array matching a pattern of closely spaced conductive bumps arranged around the periphery of a die, and can be made to exit the other surface 704 of the preformed planar structure 700 at a different, larger pitch, for matching a pattern of conductive bumps (or pads) on an underlying substrate (e.g., PWB), which may be arranged in a rectangular array of rows and columns.

FIG. 7a shows a top view of the preformed planar structure 700, and is illustrative of relatively close spacing of the top openings 706 of the through holes 710 as they exit the die-mounting face 702 of the preformed planar structure. Dashed lines indicate the angled trajectory of the through holes 710 through the preformed planar structure 700, ending in bottom openings 716 which are relatively more widely spaced than the top openings 706.

FIG. 7b shows a top view of a similar preformed planar structure 700'. Whereas the preformed planar structure 700 of FIG. 7 showed through holes 710 the top openings of which were arranged in rows, the preformed planar structure 700' has through holes 710' with top openings 706' arranged in a rectangular array on a top (die mounting) surface 702 thereof. As indicated by dashed lines, the through holes 710' generally "fan outward" as they pass through the preformed planar structure 700', ending in bottom (substrate-side) openings 716' which are generally wider spaced than the top side openings 706'.

The through holes 710 or 710' are filled with conductive material (not shown) in one of three ways at each surface: (1) the conductive material is recessed below the surface (compare FIG. 6); (2) the conductive material is flush with the surface (compare FIG. 6a); (3) the conductive material extends out of the surface (compare FIG. 6b). Ball bumps may suitably be applied to the non-die side of the pitch-spreading interposer, and a die mounted thereto can be encapsulated as in FIG. 6c.

The preformed planar structure of this invention can be advantageously applied to situations where it is desirable to package semiconductor dies and attach the packaged dies to underlying substrates having a rectangular array (rows and columns) or ring-shaped array (e.g., as in FIG. 7a) of connection points.

The preformed planar structure (interposer) of this invention can also be advantageously applied to situation where it is necessary to accommodate less regular arrangements of connection points. For example, a substrate might have connection points disposed in a zig-zag (or seemingly random) pattern to mate with corresponding solder bump contacts on a semiconductor die arranged in a linear configuration. By providing a preformed planar structure similar to that described with respect to FIG. 7a, but having bottom side (substrate side) through hole openings matching the zig-zag pattern and top side (die-side) through hole openings in a linear arrangement, the die can be readily adapted, i.e., connected, to the substrate. In other words, the interposer of this invention can serve not only as a pitch spreader, but can also be advantageously employed as an adapter to join connection points (e.g., of a die and a substrate) having completely dissimilar patterns. It will be readily appreciated by one of ordinary skill in the art that many different types of connection point adaptations can be accommodated by the present invention.

It is possible to mount a die to one face of a printed circuit board, for example using wire bonding techniques, and to provide the other face of the printed circuit board with solder bumps (e.g., a two-dimensional rectangular array of raised contacts). Generally, the printed circuit board is provided with plated vias holes connecting wiring traces on the one (die) side of the board to the other (ball bump) side of the board. Additionally, there are traces on the bottom side of the board connecting the plated vias to the ball bumps. An inherent problem with the traces and ball bumps on the other (ball bump) side of the board is that the plated vias are generally arranged around the periphery of the board, and must navigate through adjacent ball bumps, especially to connect to ball bumps located in central areas of the array. Consequently, the ball bumps must be arranged with rather wide spacing, to accommodate one or more (typically more) traces passing therebetween.

By using the preformed planar structure (e.g., 700) of the present invention, there is no need for traces on the bottom (away from the die) side of the package body. As mentioned hereinbefore, the bottom side of the preformed planar structure may be provided with conductive ball bumps, for surface-mounting the packaged die to a printed circuit board (compare FIG. 6).

Preferably, the face of the preformed planar structure to which the die is attached is provided with a thermoplastic layer, or the like (compare 40), which will have the effect of drawing the semiconductor die into intimate contact with the preformed planar structure.

FIG. 8 shows an alternate embodiment of the invention, wherein a die 800 is mounted to a face of the preformed planar structure 800, and is connected with bond wires 804 thereto. In other respects, the preformed planar structure may be similar to any of the preformed planar structures (606, 700) set forth hereinabove. For example, the through holes 806 can be formed at angles with respect to the faces of the preformed planar structure.

It will be readily appreciated by one of ordinary skill in the art that any of the above-mentioned preformed planar structures can be fabricated as a multi-layer structure. FIG. 8a shows an example of such a multi-layer structure, similar to that shown in FIG. 8, except that three laminated layers 802a, 802b, and 802c form the preformed planar structure. In this case, through holes can be "stepped" (they can follow non-linear paths). A through hole consisting of three parts, 806a, 806b, and 806c, is shown extending through the three layers 802a, 802b, and 802c. The topmost portion 806a (nearest the die 800) of the through hole extends vertically (as depicted) through the top-most layer 802a of the preformed planar structure. A second portion 806b of the through hole extends horizontally through the second layer 802b. A bottom-most portion 806c of the through hole extends vertically through the bottom-most layer 802c of the preformed planar structure. Techniques similar to those used for multi-layer printed circuit boards can be used to form the individual portions of the through holes in the individual layers, and to fill them with conductive material. The end result is similar to that shown in FIGS. 7a–7c and 8, where the bottom opening (substrate side) of the through hole need not be directly under the top opening (die side).

Dissolvable Preformed Planar Structure

The preformed planar structures (interposers) of commonly-owned parent U.S. Pat. Nos. 5,111,279 and 5,168,346 generally disclose a "spacer" or "interposer" between a semiconductor die and another die or substrate. Evidently, when a chip (or chips) is assembled to a substrate, as indicated by FIG. 3, the preformed planar structure (40, 50) remains interposed between the chip(s) and the substrate, and may provide for entrapment of contaminants. Contaminants in a flip-chip structure (assembly) are generally undesirable, and may lead to device failure.

It is therefore an object of this embodiment of the invention to provide means for alleviating (avoiding) entrapment of contaminants in flip-chip assemblies incorporating an interposed preformed planar structure.

According to the invention, a dissolvable preformed planar structure can be formed similarly to other preformed planar structures described herein (especially those of FIGS. 3–5), and used to assemble a semiconductor die to a substrate in much the same manner as described hereinabove (e.g., with respect to FIG. 3). After assembly, the preformed planar structure is dissolved with a suitable solvent, permitting more effective removal of contaminants trapped during the assembly process.

FIG. 9a is a cross-sectional view of a flip-chip assembly, prior to soldering, similar to that of FIG. 3, but employing a dissolvable preformed planar structure 40'. As in FIG. 3, the flip-chip assembly 30 includes one or more silicon chips 32 (two shown) ultimately mounted in face-to-face relationship to a larger silicon chip or substrate 14. Solder balls 36 are formed on the face 32A of each chip 32, and solder balls 38 are formed on the face 34A of the substrate 34 in corresponding positions. Also as in the assembly of FIG. 3, liquid flux is not applied to the face 34A of the substrate 34, prior to soldering the chips 32 thereto. Nor is liquid flux required to be applied to the faces 32A of the chips 32. Prior to soldering the chips 32 to the substrate 34, the preformed planar structure 40', is interposed between the chips 32 and the substrate 34.

As in the assembly of FIG. 3, the preformed planar structure 40' is dipped (not shown) in liquid flux, so that it adheres within the bore of the through holes (or to the surface of the cutouts). This selective application of flux to the solder balls has the same advantages as described hereinabove with respect to FIG. 3 and can be controlled in the same manner as described hereinabove.

After soldering (application of heat to reflow the solder balls), solder joints form within the through holes (or cutouts), and the preformed planar structure is removed by exposing it to a suitable solvent. The result is shown in FIG. 9b, wherein electrical connections 36A formed by reflow soldering remain after removal of the preformed planar structure 40'. After dissolution of the preformed planar structure 40', the assembly 30 can be cleaned with a suitable solvent to remove any remaining contaminants. Alternatively, the preformed planar structure 40' can be made of a material which is soluble in the solvent used to remove the contaminants, permitting dissolution of the preformed planar structure 40' and removal of the contaminants in a single step. One skilled in the art to which this invention most nearly pertains will understand that the solvent must be chosen in accordance to the particular material of which the interposer (preformed planar structure) is formed.

It will be readily appreciated by one of ordinary skill in the art that the use of a dissolvable preformed planar structure provides all of the assembly advantages of the other preformed planar structures described hereinabove, and has the additional advantage that by removal (dissolution) of the preformed planar structure; any contaminants trapped during assembly can be very effectively eliminated. For example, the interposers of FIGS. 6, 6a, 6b, 7, 7a or 7b could readily be dissolved after the chip is connected to a substrate. Moreover, it is within the scope of this invention that a chip is mounted to an interposer such as that of FIGS. 6, 6a or 6b, then the interposer would be dissolved, leaving a chip with exaggerated raised contacts (e.g., 610) on the surface thereof, to later be mounted to a substrate.

Flexible Preformed Planar Structure

The preformed planar structures (interposers) of commonly-owned parent U.S. Pat. Nos. 5,111,279 and 5,168,346 are generally solid and unyielding, and therefore generally unable to conform to poorly planarized substrates such as printed circuit board substrates. (It is assumed that, typically, the die itself is relatively highly planar.) In such a case of mounting a die to a non-planar substrate surface, the interposer structure could actually "lever" the die away from the substrate, which would lead to less reliable solder bump attachment.

According to the invention, the interposer is formed as a ring like structure, rather than as a solid volumetric structure such as has previously been described (e.g., 40). The various "legs" of the ring are relatively (to the volumetric solid) insubstantial and, hence, are able to skew (deform) themselves to accommodate surface irregularities on the surface of an underlying non-planar substrate.

According to an aspect of the invention, the interposer is formed as a ring-like structure with a gap for extra flexibility.

According to a feature of the invention, the interposer structure is formed of polyimide, alumina, berylia, silicon, silicon dioxide, or the like. Materials of unusually high stiffness can be used, and the resulting interposer structure will still exhibit the necessary flexibility for non-planar substrates.

The present invention recognizes (assumes) that bond pads (solder bumps) will generally be arranged in a linear array just inside the periphery of a die.

In an alternate embodiment of the invention, a ring-like interposer structure is provided with a plurality of notches ("kerfs") so that it will exhibit the necessary flexibility for non-planar substrates. Preferably, the kerfs are disposed between the locations of the through holes. The kerfs may be disposed on the top and/or bottom surfaces of the ring-like interposer.

FIG. 10a shows an embodiment of the ring-like interposer structure 1000a of the present invention formed in a narrow, solid (closed) ring 1002a. Because of the narrow legs of the ring shape 1002a, the interposer 1000a is capable of a certain amount of flexing to conform to an irregular surface. By flexing and conforming, the aforementioned "levering" of the die is reduced or eliminated. As stated hereinabove, the ring-like shape of the interposer assumes a similarly shaped ring-like array of solder bumps on a die and substrate between which the interposer will be assembled. The shape of the ring-like interposer 1000a can be readily adapted to any "outline"-shaped array of bond pads, e.g., triangular, circular, etc.. Through holes are omitted from this view, for illustrative clarity, but would be similar to the through holes of the preformed planar structure of FIG. 3. Additionally, the through holes could be pre-filled, as in FIGS. 6, 6a or 6b.

FIG. 10b shows another embodiment of the ring-like interposer structure 1000b of the present invention. In this embodiment, the interposer 1000b is formed as a ring-like structure 1002b with a gap 1004. As a result of the gap 1004, the ring-like structure 1002b is an "open" ring, and the resultant interposer 1000b is even more compliant than the interposer 1000a of the previous embodiment.

In both embodiments, the outside dimension of the interposer is approximately equal to the outside dimension of the die to be attached, and is provided with through holes (not shown) aligned with solder balls on the die (not shown).

In either embodiment, the ring-like interposer structure is able to accommodate significant non-planarity of an underlying substrate without introducing significant levering effects associated with the solid interposer. The interposer does not serve to render the substrate more planar, but by better conforming to surface irregularities (non-planarities) of the substrate the interposer prevents "amplification" of (transmitting of) the non-planarity as "seen" by the die to be attached to the substrate.

The ring-like interposer structures of the present invention are of great advantage when used in conjunction with substrates which are not surfaces of conic projections. For substrates which have surfaces of conic projections and moderate height, solid (versus ring-like) interposers, especially those of certain polymer materials, can accommodate the simple bend of the surface. For substrates of irregular or "bumpy" surface structure, a solid interposer cannot accommodate the bending in the required three dimensions. In the latter case, the ring-like interposer (e.g., 1000a) of the present invention can be used, because the thin ring-like structure can be bent in three dimensions at the same time without the puckering distortions that would be observed in solid interposers. For substrates of perverse surface structure, the ring-with-gap embodiment (1000b) described hereinabove can follow even more significant surface irregularities and still accomplish the objectives of using an interposer structure between a chip and a substrate (e.g., establishing a prescribed standoff and causing the solder joints to be of predetermined mechanical characteristics).

Through-holes are assumed to be present, but are not shown for the interposers of FIGS. 10a and 10b, in order to reduce illustrative clutter. Any of the techniques described hereinabove for the formation of interposers with through holes, solder bumps, liquid flux, etc., may be used in conjunction with a ring-shaped interposer.

In order to better accommodate irregularities in the surface of a substrate, it is possible to "kerr" the interposer in much the same manner as woodworkers are known to "kerf" wood strips to facilitate their being bent into smoothly curved shapes. "Kerfing" is a technique of cutting a series of grooves (notches) in a structural member perpendicular to an intended direction of bending. The grooves effectively "weaken" the member in the direction of bending without significantly altering its stiffness perpendicular to the bend. Such "kerfing" of preformed planar structures is described hereinbelow with respect to FIGS. 10c–10f.

FIG. 10c shows an enlarged top view of a portion of a leg 1002 of a "kerfed" ring-shaped interposer, applicable to the ring-shaped interposers 1000a and 1000b described hereinabove with respect to FIGS. 10a and 10b, respectively. Through-holes 1010 through the leg 1002 of the interposer permit alignment and controlled formation of solder bump contacts as described hereinabove. Slots or grooves (kerfs) 1012 cut (kerfed) in the top surface (as depicted) of the leg 1002 facilitate bending of the leg 1002 in the vertical direction (out of the page, as depicted). FIG. 10d is a side view of the kerfed leg 1002 of FIG. 10c. Evidently, the kerfs 1012 will allow the interposer 1002 to bend in one axis, but will not significantly reduce the stiffness of the interposer in another axis (e.g., out of the page, as shown in FIG.

10d). In the embodiment of FIGS. 10c and 10d, the interposer is kerfed on one surface only, with the kerfs being disposed between the through holes.

Alternatively, the leg 1002 can be kerfed on both its upper and lower surfaces, as shown in FIGS. 10e and 10f, depicting top and side views, respectively. In this case, slots 1012a are also cut in the lower surface of the leg 1002. FIGS. 10e and 10f show the upper slots 1012 and lower slots 1012a in an alternating pattern, but it will be readily apparent to one of ordinary skill in the art that the slots 1012 and 1012a may also be disposed opposite one another. The depth and placement of the slots 1012 and 1012a control the degree of flexibility of the leg 1002. However, when providing deep slots, increased flexibility comes at the cost of the overall strength of the interposer, i.e., deep slots can significantly weaken the interposer.

It is within the spirit and scope of the present invention to combine the techniques described hereinabove with the ring-shaped flexible interposer. For example, in a manner similar to that described with respect to FIG. 3, the flexible interposers can be dipped in liquid flux, etc.. Further, the flexible interposer can be made of a dissolvable material and removed after soldering as described hereinabove with respect to FIGS. 9a and 9b.

Interposer With Integral Probe Fingers

The preformed planar structures (interposers) of commonly-owned, parent U.S. Pat. Nos. 5,111,279 and 5,168,346 are provided with through holes or peripheral cutouts which allow the solder balls of a chip (located on one side of the interposer) to fuse with the solder balls of a substrate (located on the other side of the interposer). When using the through hole embodiment, the resulting solder joints are contained completely within the through holes, and lack controllability and observability. Any attempted probing of the solder joint connections, for whatever intended purpose, is similarly obviated by the fact that the solder joints are hidden within the preformed planar structure. Even in the peripheral cutout embodiment of the interposer, where the solder joints are partially exposed at the periphery of the preformed planar structure, it would be difficult, at best, to probe the joints, due to their location between a chip and a substrate, as well as their small dimensions. Even in the case of a using an interposer such as shown in FIG. 7b, where there is a rectangular array of bond pads (solder bump contacts) between a die and a substrate, probing of "inner" bumps would be virtually impossible, even if a dissolvable interposer (preformed planar structure) were used. Further, any mechanical probing of the surface of a die can cause damage to the die.

According to the invention, a plurality of probe fingers are incorporated into the interposer. For at least a portion, preferably all, of the through holes in the interposer, one end of a probe finger extends to within the through hole, so that when the solder joint between the two solder bumps is made, the probe finger is completely immersed in solder and makes excellent electrical contact with the solder joint. The probe finger extends laterally through the interposer, at least to the peripheral edge of the interposer, and preferably beyond the edge of the interposer. In this manner, making electrical contact to the solder bumps (and solder joints) is accomplished via the probe fingers integral with the interposer.

FIG. 11a is a cross-sectional view of a portion of an embodiment of an interposer with integral probe fingers. An assembly 1100 of a die 1110 to a substrate 1130 includes an interposer 1120 with a probe finger 1125. The die 1110 has a solder ball contact 1140a disposed on a lower face 1110a thereof. The lower face 1110a is positioned above an upper face 1120a of the interposer 1120 such that the solder ball contact 1140a extends into a through hole 1150 in the interposer. The substrate 1130 has a matching solder ball contact 1140b disposed on a surface 1130a thereof. The surface 1130a of the substrate 1130 is positioned below a lower face 1120b of the interposer, such that the solder ball contact 1140b extends into the opposite end of the through hole 1150. A conductive lead 1125 within the interposer 1120 extends into the through hole 1150 to form a probe finger 1125a. The assembly 1100 is shown prior to reflow soldering. After reflow soldering, the two solder ball contacts 1140a and 1140b will fuse into a single solder joint structure, electrically connecting the die to the substrate. Moreover, the portion of the probe finger extending into the through hole in which the solder joint is formed will be in intimate mechanical and electrical connection with the resulting solder joint. Although only one probe finger is shown, any number of probe fingers can be extended in similar fashion into any number of respective through holes in any of the interposers described hereinabove or hereinbelow.

The ability to provide a separate means (i.e., probe finger) by which contact can be made to a solder bump contact provides for several novel connection schemes. At the simplest level, selected solder bumps can be connected to one another, without increasing the complexity of either of the solder bump substrates. This permits some increase in complexity of the total circuit without significantly increasing the design or construction complexity of the semiconductor die. Such an arrangement is depicted in FIG. 11b, wherein an assembly 1100a similar to that shown as 1100 in FIG. 11a has two solder bump contacts 1142a and 1142b joined by a conductive lead 1125 within the interposer 1120. As before, the die 1110 is positioned with its lower face 1110a above the upper face 1120a of the interposer and the substrate is positioned with its upper face 1130a under the lower face 1120b of the interposer. The solder bump contacts 1142a and 1142b in through holes 1150a and 1150b, respectively, are shown after reflow soldering. The solder bump contacts capture and are electrically connected by the conductive lead 1125 which extends into the through holes 1150a and 1150b. In this case (i.e., for the purpose of connecting two solder joints together), it is not necessary that the probe finger extend to without the peripheral edge of the interposer, although that may be desired and implemented.

Assuming that a die and a substrate (which may be another die) are of approximately the same size (e.g., two flip-chipped dies), it is very difficult, using conventional means, to join them together into any useful configuration, because there is no room to make conventional (e.g., wire bond) electrical contact from the flipped-together dies to a package or circuit board. The use of a traced interposer with the probe fingers extended out to external leads or contacts solves this problem. Two dies are joined face-to-face with a traced interposer disposed between the two dies. The traces of the interposer extend outward from the solder bump area, for connecting the two flip-chipped dies to another substrate.

It will be readily appreciated by one of ordinary skill in the art that the use of the interposer with finger traces can facilitate face-to-face (flip-chipped) connections between dies of virtually any relative sizes. It will further be appreciated that it is possible for the interposer finger traces to extend out from the edges of the die stack as conductive leads or contacts to become part of any of a large variety of packages and substrates, including: printed circuit boards, plastic packages, and M-Quad packages, to name but a few examples.

FIG. 11c illustrates the case wherein two similar-size dies 1170a and 1170b are flip-chip assembled with a "traced" interposer (e.g., 1120, FIGS. 11a and 11b) disposed between them to form an assembly 1155. The traces within the interposer (not shown, compare FIG. 11a) are extended outside of the interposer to form leads 1180 by which the assembly 1155 can be mounted and electrically connected to a substrate 1160.

It will be readily appreciated by one of ordinary skill in the art that a single interposer can be sized to extend across several dies, and need not be restricted to assemblies of two dies, or a die and a substrate. Since the interposer can extend across the area of several dies and/or substrates, evidently a substantial improvement in circuit density can be realized, with the associated aforementioned benefits of the use of the present inventive techniques. It should be noted that the interposer technology of the present invention is completely compatible with conventional printed circuit board manufacturing technology.

One of ordinary skill in the art will appreciate that it is possible to create interposers including multiple layers of traces between layers of insulating material. Assuming adequate dielectric characteristics of the insulating layers, it is possible to create wiring structures in the interposer which cross each other without electrically shorting. Also, in a manner similar to that used in multi-layer printed circuit boards, the multiple layers of traces can be interconnected (e.g., by conductive vias), as desired.

According to one aspect of the invention, the probe fingers can become part of a structure which can be used to test the die functionally. A plurality of traces exiting the interposer can be connected to a test system, for testing the die in ways otherwise not possible via the substrate, for example, by providing access to every solder bump contact of the die. Such an arrangement is shown in FIG. 11d.

FIG. 11d shows an assembly 1185 including an interposer 1190 to which at least one die (not shown) is mounted. Conductive traces 1194 are disposed within the interposer 1190 (compare FIG. 11a) to respective connection points 1192 (e.g., similar to probe fingers 1125a of FIG. 11a). A ribbon cable 1195, or other suitable interconnection means is electrically connected to the traces 1194, where they exit the peripheral edge of the interposer, thereby forming an electrical interface for external test equipment (not shown).

According to another aspect of the invention, the probe fingers can be made to create separate interconnections (e.g., via a cable similar to 1195, or other suitable interconnection means) between two-or-more interposer structures (e.g., 1190), thereby permitting increased wiring complexity without increasing the complexity of either the die or the substrate. In other words, the probe finger traces exiting two or more interposers (such as the interposers shown in FIGS. 11c and 11d) can be connected to one another, and in some cases not connected to an underlying substrate at all.

It will be readily appreciated by one of ordinary skill in the art that the "traced" interposers of this invention, with their associated probe finger contacts, may provide electrical contact with the solder bumps on a facing die, if the die and substrate are placed under moderate pressure to force them together, even before the solder bumps are melted together. (This assumes, of course, that the through holes in the interposer are sized to permit the solder ball on the die to contact the probe finger.) This feature would permit preliminary testing of the die and substrate prior to final assembly (i.e., prior to heating to fuse the solder balls to one another).

It is important to note that the interposers of the present invention are not required to be, but preferably are, mechanically strong enough to support the mounting of a facing die, or of a die and a substrate, to another major assembly, without other mechanical reinforcement. The material of the interposer is chosen to give the required mechanical properties. Although an interposer can be made of a single insulating and a single conducting material, benefits can be realized from the user of several different materials which are used as a series of layers to create the interposer.

Adhesive layers, e.g., contact adhesive, thermoplastic, or a thermosetting resin material can be applied to the faces of the interposer. These adhesive layers can be made to adhere strongly to a die, to a substrate material, or even to a PCB. The adhesive layer causes the die (or substrate) to grip the interposer firmly, providing additional mechanical stability.

As reflow-soldered circuits undergo temperature cycling, it is not uncommon for failures to occur at the solder bump structure due to thermally induced flexing. By holding the die to a substrate via an adhesive layer, the flexing that might otherwise break the connection between the die and the substrate is reduced. The adhesive can also be used to keep the substrate/interposer/die stack under compression, which has the benefit of holding together solder bumps which might otherwise be mechanically weakened.

Inert Metal Stoppers retarding electrogalvanic-induced corrosion

The preformed planar structures of commonly-owned U.S. Pat. Nos. 5,111,279 and 5,168,346 are provided with through holes or peripheral cutouts which allow the solder balls of a chip (located on one side of the interposer) to fuse with the solder balls of a substrate (located on the other side of the interposer).

Solder balls (or bumps) are structures which are used to electrically connect a circuit board or other substrate to a semiconductor chip. These bumps are created in a number of ways, including: electron beam evaporation, high vacuum sputtering, and electroplating. In each process there are variations which make it difficult to maintain the exact composition of the deposited material from run-to-run. As a result, there can be significant differences in the composition of solder bumps on different substrates, even though they may have been formed by a similar process.

Solder bumps are typically fabricated from a variety of metals and their associated alloys. Typical of these metals are: lead, tin and zinc. Unless the solder bump structures on both the substrate and the chip are of exactly the same composition, electro-galvanic corrosion of the resulting solder joints can occur. The subject of electro-galvanic corrosion is discussed, in another context, in U.S. Pat. No. 4,478,915, incorporated by reference herein.

According to the invention, an inert metal film structure is provided in the interposer and physically separates the dissimilar alloys of dissimilar solder bumps, and largely inhibits electrogalvanic corrosion processes that would otherwise be associated with solder joints formed by mixed (dissimilar) solder bumps.

Generally, a thin film (foil) of a noble (inert to galvanic corrosion) metal is incorporated into the holes of the interposer to galvanically isolate the bumps of the chip from those of the substrate. Electrical conductivity between the bumps of the chip and the substrate is maintained by the conductivity of the noble metal. By physically separating the bumps of the chip from the bumps of the substrate, chips having solder bumps formed of various metals (and alloys) can be joined to a substrate, and vice-versa, without concern for galvanic corrosion.

FIG. 12 is a cross-sectional view of an interposer having a noble metal foil disposed in a through hole (one of many shown) to galvanically isolate the material of the die ball bump from the material of the substrate ball bump, while permitting effective electrical connection between the two ball bumps. An assembly 1200 of die/interposer/substrate is illustrated at a stage immediately prior to reflow soldering. The semiconductor device assembly 1200 is formed of a semiconductor die 1210, an interposer (preformed planar structure) 1220, and a substrate 1230. A solder bump contact 1240a is disposed on a bottom surface 1210a of the semiconductor die 1210. A mating solder bump contact 1240b is disposed on a top surface 1230a of the substrate 1230. A through hole 1250 extends through the interposer from its top surface 1220a to its bottom surface 1220b. An inert metal film 1225 (e.g., gold) is embedded in the interposer 1230 such that it extends into and across the through hole 1250, effectively blocking the hole 1250 and dividing it into a top portion 1250a and a bottom portion 1250b. The bottom surface 1210a of the semiconductor die 1210 is positioned in face-to-face alignment with the top surface 1220a of the interposer, such that the solder bump 1240a on the die 1210 extends into the top portion 1250a of the through hole 1250 towards the noble metal film 1225. The top surface 1230a of the substrate 1230 is positioned in face-to-face alignment with the bottom surface 1220b of the interposer, such that the solder bump 1240b on the substrate 1230 extends into the bottom portion 1250b of the through hole 1250 towards the noble metal film 1225.

When heat is ultimately applied to reflow the two solder bump contacts 1240a and 1240b, they will melt and bond to their respective sides of the metal film 1225. Because of the metal film 1225, the two solder bump contacts 1240a and 1240b can not come into direct (physical or chemical) contact with one another, but electrical conductivity therebetween is provided by virtue of the electrical conductivity of the noble metal film 1225. As a result, an electrical and mechanical bond is formed between the solder bump contact 1240a and 1240b without a chemical bond which could cause electrogalvanic corrosion.

It will be readily appreciated by one of ordinary skill in the art, that since the noble metal film 1225 is in electrical contact with the two solder bumps, it could readily be extended to outside the peripheral edge of the interposer in the manner of the probe fingers and traces (see FIGS. 11c and 11d) to provide external access to the solder bump contacts 1240a and 1240b via the interposer, or could be extended within the interposer structure to form electrical connections with other solder bumps (see FIG. 11b). The only significant difference between the arrangement of FIG. 12 and those of FIGS. 11a and 11b is that the noble metal film 1225 physically separates the solder bumps 1240a and 1240b after reflow, while the probe finger 1125a (FIG. 11a) permits the solder bumps (1140a and 1140b) to flow around the end of the probe finger and mix after reflow.

Stepped Interposer structures

The preformed planar structures (interposers) of commonly-owned U.S. Pat. Nos. 5,111,279 and 5,168,346 are provided with through holes or peripheral cutouts which allow the solder balls of a chip (located on one side of the interposer) to fuse with the solder balls of a substrate (located on the other side of the interposer). The preformed planar structure is disposed entirely between the chip and the substrate. Generally, in use, the interposer is placed on the substrate, and the chip is placed on the interposer. Although the through holes (or peripheral cutouts) provide some self-alignment of the die to the substrate, the process still requires accurate placement of the die.

It is therefore an object of the present invention to provide an interposer that functions to self-align a die over a substrate.

According to the invention, an interposer is formed which has a cavity in its top surface, into which the die is placed. Preferably, the cavity has tapering side walls to facilitate placement of the die into the interposer cavity. Evidently, such an interposer must be larger than the die, since the cavity is approximately the size of the die. Hence, there is a portion of the interposer that is between the die and the substrate, and a portion (including the cavity) that encompasses the die (surrounds the edge of the die). The interposer may be formed as an integral unit (both portions formed as one piece), or the die-encompassing portion can be formed separately and joined to the interposed portion. In the latter case, preferably, indexing keys are formed on the joining faces of the two portions to ensure that they are correctly assembled to one another. The two portions are joined with a suitable adhesive or by ultrasonic bonding.

FIG. 13a shows a portion of a semiconductor device assembly 1300 using a one-piece stepped interposer 1302. The interposer 1302 has a cavity 1310 extending into its upper surface 1302a. The cavity 1310 is sized and shaped to receive and align a semiconductor die 1320. Through holes 1330 (one of many shown) extend from the cavity (underneath the die 1320) through the bottom surface 1302b of the interposer, to provide further alignment of the die 1320 (by its solder bump contacts, not shown) and controlled formation of solder bump electrical connections.

In use, a die is placed in the cavity of the interposer, and both are assembled to a substrate. The interposed portion of the interposer (i.e., the portion underneath the die) can be provided with unfilled through holes (compare FIG. 3), with filled through holes (compare FIGS. 6, 6a, 6b), the die can be encapsulated (compare FIG. 6c), the interposer can function as a pitch spreader/adaptor (compare FIGS. 7, 7a, 7b, 8, 8a), the interposer may be dissolvable (compare FIGS. 9a, 9b), the interposer can be formed as a ring-like structure (compare FIGS. 10a-f, in which case a portion of the cavity would extend completely through the interposer), and the interposer can be provided with probe fingers (compare FIGS. 11a–d) or anti-galvanic foils (compare FIG. 12).

The interposer can also be designed to accommodate more than one semiconductor die, as shown in FIG. 13b.

FIG. 13b is a cutaway view of a portion of an arrangement 1300a using a two-piece stepped interposer designed to accommodate two semiconductor dies. The interposer is formed of a planar base portion 1304 and a top portion 1306. The top portion 1306 has tapered openings 1310a and 1310b sized and shaped to receive and align semiconductor dies 1320a and 1320b, respectively. The top portion 1306 is assembled to a top surface 1304b of the base portion 1304 such that when placed in the openings 1310a and 1310b, the dies 1320a and 1320b, respectively, rest on the top surface 1304b of the base portion. Through holes 1330 and 1330a under the dies 1320a and 1320b extend through the base portion 1304 to its bottom surface 1304a. Solder bump contacts on the dies (not shown) extend into these holes 1330 and 1330a to form electrical connections with mating contacts on a substrate (not shown) to which the arrangement 1300a is ultimately assembled.

Clear or Translucent Interposer

The preformed planar structures (interposers) of commonly-owned parent U.S. Pat. Nos. 5,111,279 and 5,168,346 generally disclose an interposer aligning a die in the x, y and z axes above a substrate. One of ordinary skill in the art, however, will readily appreciate that an element other than a semiconductor die (chip) can be x-y-z aligned above a die (or substrate) in the same or similar manner.

In certain integrated circuit applications, such as EPROMs, optical sensors, and the like, it is often necessary to locate an optical element, such as a lens or a window, above a die. In some of these cases, it is important to maintain a predetermined spacing (z-axis) between the element and the die, as well as locating the element (x and y axes) directly above the die.

With certain mechanical arrangements, wherein there is an air space between the die and the element disposed above the die, condensation may form on an inner surface of the (optical) element.

It is therefore an object of the invention to provide a technique for mounting an element, such as an optical element, above a die, with predetermined x-y-z spacing and orientation, while avoiding condensation on an inner surface of the element.

According to the invention, a clear (transparent) interposer (preformed planar structure) is disposed in and fills a space between a die and an element disposed above the die.

According to an aspect of the invention, the interposer may be clear, or it may be colored. If colored, the interposer may exhibit the additional functionality of a color filter, such as for camera applications. Where image coherence is not required, as in a UV-erasable EPROM application, a translucent interposer may be used to great advantage.

According to an aspect of the invention, the interposer may have certain optical characteristics, such as:

having binary optics formed on a surface of the interposer;

having darkened areas to prohibit light from impacting selected areas (e.g., logic elements) of the underlying die, while allowing light to impact other areas (e.g., photosensitive elements) on the underlying die.

According to an aspect of the invention, the interposer can be provided with embedded conductors terminating on the die-facing of the interposer and extending to an external surface of the interposer. In this manner, electrical connections to the die can be made through the interposer.

According to an aspect of the invention, the interposer may have its die-facing surface formed with indentations or through holes (or cutouts) arranged in a pattern matching elevated features (e.g., solder balls or other "relief" features) on the die, for ensuring precise x-y alignment with the die.

According to an aspect of the invention, the interposer may have its element-facing surface formed with a lip, or the like, for ensuring precise x-y alignment with one or more edges of the element.

According to an aspect of the invention, the surface of the interposer facing away from the die can be molded as a lens, or can be formed with integral binary optics.

Examples of materials for forming a clear or translucent interposer include: quartz, silica, polyvinylchloride (pvc), polyvinylcarbonates, and lucite.

Figure 14A:
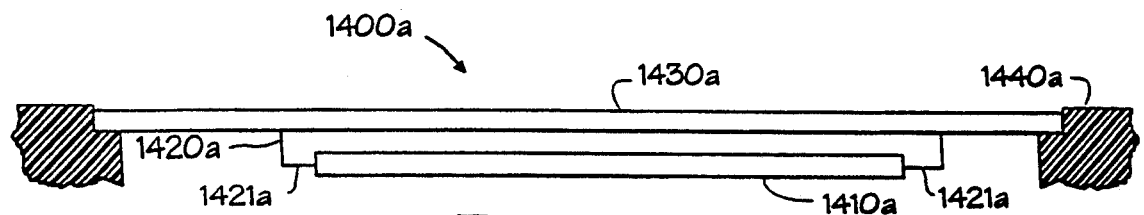

FIG. 14a is a cross-sectional view of an arrangement 1400a of a semiconductor die 1410a and a light transmissive window 1430a, separated by a substantially clear interposer 1420a. The window 1430a is built into a semiconductor device package 1440a and is, for example, a quartz window in a ceramic package for an EPROM. The interposer 1420a is "registered" to the semiconductor die by means of "lips" 1421a on the interposer 1420a which capture the edges of the die 1410a (compare the interposer with cavity of FIG. 13a) The interposer completely fills the gap between the window 1430a and the die 1410a, thereby preventing the formation of condensation therein. If image coherence is not required through the interposer (e.g., as in a UV-erasable EPROM application), then the interposer can be translucent. Otherwise, the interposer should be transparent.

Figure 14B:
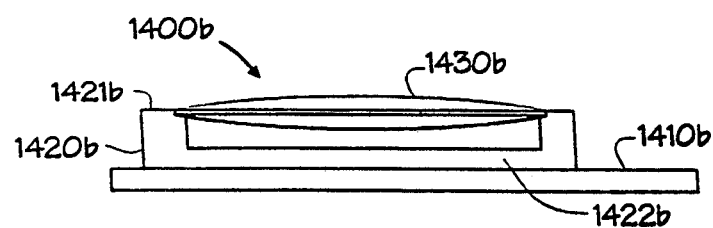

FIG. 14b is a cross-sectional view of portion of a semiconductor device assembly 1400b including a lens 1430b. In this case, a clear or colored transparent interposer 1420b is used to accurately position an optical element 1430b (lens shown) relative to a semiconductor die 1410b. The interposer 1420b has a planar section 1422b and a raised section 1421b (compare the interposer with cavity of FIG. 13a). The raised section 1421b captures and positions the optical element 1430b relative to the die 1410b. The planar section 1422b is clear and permits transmission of a coherent image therethrough. In the case of a colored transparent material, the planar section 1422b serves as a color filter for e.g., a camera application. Alternatively, the planar section 1422b can be omitted, leaving only the raised section 1421b in a ring-shaped configuration (similar to that described hereinabove with respect to FIGS. 10a–f). In the case of the ring-shaped interposer, it may not be necessary (or even desirable) to use a clear or translucent material, since the interposer could be used as a light blocking wall between an optically sensitive area and a logic area of the die 1410b.

Figure 14C:
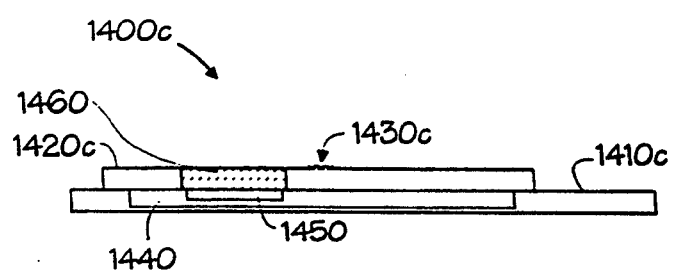

FIG. 14c illustrates another use of a clear or translucent interposer. A semiconductor die 1410c has an optically sensitive area 1440 and a logic area 1450. As is well known to those of ordinary skill in the art, semiconductor devices are generally light sensitive, and in order to prevent mis-operation of logic elements (e.g., 1450), it is often necessary to shield them from exposure to light. However, on the semiconductor die 1410c which has both an optically sensitive area 1440 and a logic area 1450, a transparent or translucent interposer 1420c with a darkened (light blocking) area 1460 is used to shield the logic 1450 from extraneous exposure to light. In a camera application, the non-light-blocking area of the interposer could be a colored transparent material to act as a colored filter, or a clear in an application which does not require color selectivity. Other applications which do not require image coherence through the interposer 1420c can make use of a translucent material.

The surface of the interposer 1420c can also be given other optical characteristics, such as binary optic features 1430c formed on the surface of the interposer. (In order for this to be useful, the interposer must be made of a clear or colored substantially transparent material.

The interposers 1420b and 1420c described with respect to FIGS. 14b and 14c, respectively, can be aligned to the semiconductor die by means of indentations or raised features (not shown) to mate with corresponding raised features (e.g., solder bumps) or indentations, respectively, on the semiconductor die.

Figure 14D:
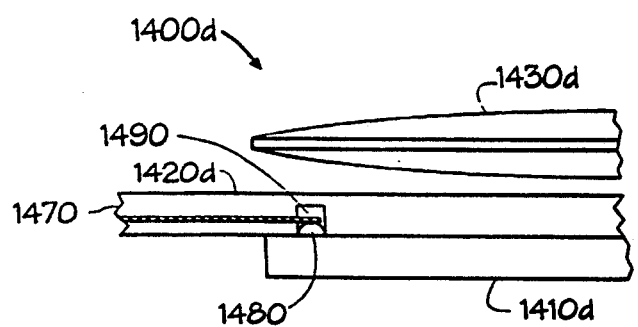

FIG. 14d illustrates a semiconductor device assembly 1400d which combines the clear/colored/translucent interposers with the traced interposer techniques described hereinabove with respect to FIGS. 11a–d. In this case, an optically sensitive semiconductor die 1410d has one or more solder bump contacts 1480 disposed on the top surface thereof. A clear, colored, or translucent interposer 1420d is aligned over the semiconductor die 1410d by means of one or more indentations 1490 in the interposer which mate with the one or more solder bumps 1480. In a manner similar to that described with respect to FIG. 11a, conductive traces 1470 extends into the indentations and, after reflow soldering, make contact with the solder bump contacts 1480. The traces can be used to connect to other solder bumps, to connect to (or form) pins of a package body, etc..

Use of preformed planar structure in multi-chip structures

The preformed planar structures (interposers) of commonly-owned parent U.S. Pat. Nos. 5,111,279 and 5,168,346 and method of assembling flip-chip type assemblies contemplates, for example, mounting two dies to a substrate (see e.g., FIG. 3). The use interposers can also be extended to more elaborate assemblies of chips.

Semiconductor technology has shown a general trend towards dramatic increases in integrated circuit speed and density. Both of these trends are fueled by a general reduction in device (active element) geometries. As semiconductor devices become smaller, the distances between them on a semiconductor die become smaller, and parasitics (such as parasitic capacitances) and switching currents become smaller. In technologies such as CMOS, where overall current draw and switching speed characteristics are dominated by the effects of parasitics, the result is a reduction in total power consumption at the same time as switching speed is improved. Overall speed is further improved by the reduction in signal propagation time between active devices (e.g., transistors) resulting from the shorter distances involved. In today's high speed integrated circuitry based on sub-micron geometries, delays in the tens or hundreds of picoseconds can be appreciable.

Typically, integrated circuit dies (chips, or semiconductor dies) are diced (cut apart, or singulated) from a semiconductor wafer and are assembled into integrated circuit packages which have pins, leads, solder (ball) bumps, or conductive pads by which electrical connections may be made from external systems to the integrated circuit chip. These packages are then typically applied to circuit board assemblies comprising systems of interconnected integrated circuit chips.

The aforementioned dramatic improvements in integrated circuit speed and density have placed new demands on integrated circuit assemblies, both at the chip and circuit board levels. Without attendant improvements in these areas, much of the benefit of high device speed is lost. Wiring propagation delays and transmission line effects, in integrated circuit packages and on circuit board assemblies, which were once negligible are now significant factors in the overall performance of systems based on high-speed integrated circuitry. In order to achieve the potential higher system-level performance opportunities afforded by the new high-density technologies, it is necessary to reduce the amount of signal propagation time between integrated circuits.

Another significant factor in achieving high system-level performance is signal drive capability. Longer signal paths are susceptible to noise (cross-talk, etc.) and require low-impedance, high-current drive circuits on the integrated circuit chips (dies). Such circuits tend to occupy large portions of the die area (either reducing the area available for other circuitry or increasing the overall die size), and can introduce significant delays of their own. Clearly, shorter signal paths and their attendant low signal drive current requirements are desirable to achieve high performance.

Generally, the use of flip-chip arrangements facilitates high-density, high-performance packaging. Examples of various prior-art "flip-chip" constructions are found in U.S. Pat. Nos. 3,388,301; 4,545,610; 4,190,855; 4,811,082; 4,926,241; 5,039,628; 4,970,575; 3,871,014; and in Japanese Patent Numbers 61-142750; 61-145838; 57-210638; and in "Wafer-Chip Assembly for Large-Scale Integration", IEEE Trans. Elec. Dev., Vol. ED-15, No. 9, Sep. 1968.

Copending, commonly-owned U.S. patent application Ser. No. 07/975,185, filed Nov. 12, 1992 by Rostoker, describes multi-chip, multi-tier semiconductor arrangements based upon single and double-sided flip-chips. The double-sided flip-chips provide raised bump contact means on both major surfaces of a die and provide connections to internal signals within the die, feed-through connections between contacts on opposite sides of the die, and jumpered connections between contacts on the same side of the die. Various multi-chip configurations are described. Certain of these flip-chip configuration dramatically increase the ratio of I/O area (periphery) to footprint area, permitting larger numbers of I/O points within a given assembly footprint than would otherwise be possible in a single die configuration.

It is an object of this invention to provide an improved technique for forming multi-chip semiconductor assemblies, especially stacked multi-chip assemblies.

According to the invention, flip-chip assemblies are formed using a preformed planar structure interposed between the chip(s) and the substrate. This includes chip-on-chip, chips-on-chip, small die on large die, more than one small die on a larger die or substrate, "brickwork" and multi-tier arrangements. The preformed planar structure may have either through holes or peripheral cutouts. Unless otherwise specified, the terms "chip", "die" and substrate are generally used interchangeably.

Chip-on-chip assemblies have been described hereinabove, and can use any of the different types of interposers. Some arrangements have been described as assemblies of a semiconductor die to a substrate with an interposer (preformed planar structure) between, but it will be readily appreciated by one of ordinary skill in the art that a semiconductor die may be employed as a substrate, thereby effectively forming multi-chip assemblies. In particular, FIG. 11c described a face-to-face flip-chip assembly with an intervening interposer. Conductive traces embedded in the interposer were used as "pins" of the flip-chip assembly for further assembly to another chip or substrate.

FIG. 15a shows a small-die-on-large-die flip chip arrangement 1500a, wherein a large die 1510a is used as a substrate. An interposer 1520a, such as those described hereinabove is disposed between the large die 1510a and a smaller die 1530a. In this case, the interposer 1520 is approximately the same size as the smaller die. The interposer 1520a can be solid (rectangular) or ring-shaped (see FIG. 10a–f), and may have embedded conductive traces (see FIGS. 11a–d, 12).

FIG. 15b shows a multi-tier flip-chip arrangement 1500b, with interposers disposed between each of the "tiers". Two "base-level" dies 1510b are bridged by a second-level die 1530b. An interposer 1520b separates the base-level dies 1510b and the second-level die 1530b. A pair of third-level dies 1531b are "flipped" on the second-level die 1530b by means of a pair of interposers 1521b, thereby forming a three-tier flip-chip structure with all advantages described hereinabove with respect to interposers in semiconductor device assemblies. As before, any of the other features of interposer described hereinabove can be employed in the flip-chip configuration, e.g., the interposers can be either solid or ring-shaped, and can have embedded conductors.

According to a feature of the invention, liquid flux is applied to the preformed planar structure in order that the flux is selectively applied to the solder balls (pads) on the chip(s) and the substrate.

According to an aspect of the invention, the preformed planar structure has a planar core and opposing planar faces. The core is formed of thermosetting organic resin, such as polyimide, or non-organic material such as alumina, polished sapphire, beryllium oxide, aluminum or aluminum nitride. The planar faces of the preformed planar structure are formed of thermoplastic resin or thermosetting material, such as polyacetal, epoxy (epoxide resins) or polystyrene.

According to an aspect of the invention, the preformed planar structure has a thickness of 5–50 microns, preferably on the order of 20–30 microns.

FIG. 15c is a cutaway view of an assembly of two semiconductor dies 1510c and 1530c separated by an interposer 1520c. The first semiconductor die 1510c has a solder bump contact 1560 disposed on a surface thereof. Similarly, the second semiconductor die 1530c has a matching solder bump contact 1550 disposed on a surface thereof. The two dies 1510c and 1530c are arranged in a face to face configuration such that the two solder bump contacts 1560 and 1550 are aligned. The interposer 1520c is disposed between the two dies 1510c and 1530c such that the solder bump contacts 1560 and 1550 extend into opposite ends of a through hole 1540 in the interposer. Upper and lower faces 1524c and 1522c of the interposer 1520c are made of a thermoplastic resin or thermosetting material, such as those described above. Upon application of heat, the faces 1522c and 1524c of the interposer 1520c form adhesive bonds with the two dies 1530c and 1510c, respectively. At the same time, the two solder bump contacts 1550 and 1560 melt and fuse to form an electrical connection between the dies 1510c and 1530c. The interposer 1520c has a thickness "d" between 5 and 50 microns, preferably 20–30 microns.

Generally, the features of the various interposers discussed hereinabove can be "mixed and matched" to suit particular applications. For example, through holes in the ring like-interposer of FIG. 10a could be provided with an anti-galvanic foil as discussed with respect to FIG. 12. Many other combinations of features, some of which have been expressly set forth hereinabove, are within the spirit and scope of this invention.

What is claimed is:

1. A flip-chip structure, comprising:
   a chip having first solder balls on a face thereof;
   a substrate having corresponding second solder balls on a face thereof;
   a separate and distinct preformed planar structure disposed between the chip and the substrate, having two opposite faces, one face in contact with the chip and the opposite face in contact with the substrate;
   through holes extending through the preformed planar structure from the one face to the opposite face;
   at least one conductive element embedded within the preformed planar structure and extending only partially into at least one corresponding through hole; and
   at least one solder joint consisting essentially of at least one first solder ball and at least one corresponding second solder ball fused within the through holes to each other and to at least one corresponding conductive element to form an electrical connection between the at least one first solder ball, the at least one second solder ball and the at least one corresponding conductive element.

2. A flip-chip structure according to claim 1, further comprising:
   at least one external connection point on the preformed planar structure connected to at least one corresponding conductive element.

3. A flip-chip structure according to claim 2, wherein:
   the at least one external connection point connects to an external cable.

4. A flip-chip structure according to claim 3, wherein:
   the external cable is a ribbon cable.

5. A flip-chip structure according to claim 2, wherein:
   the at least one connection point is connected via external conductors to at least one external connection point of another preformed planar structure.

6. A flip-chip structure according to claim 1, wherein:
   the through holes extend continuously from the one face of the preformed planar structure to the opposite face of the preformed planar structure; and
   at least some of the through holes are angled such that openings of said angled through holes on the one face of the preformed planar structure occur at points not directly opposite corresponding openings on the opposite face of the preformed planar structure.

7. A flip-chip structure according to claim 2, wherein:
the at least one conductive element is a noble metal foil; and
the at least one solder joint is formed from the at least one first solder ball fused to one side of the noble metal foil in the first portion of the through hole and the at least one corresponding second solder ball fused to another side of the noble metal foil in the in second portion of the corresponding through hole.

8. A flip-chip structure according to claim 7, further comprising:
at least one external connection point on the preformed planar structure connected to at least one corresponding conductive element.

9. A flip-chip structure according to claim 8, wherein:
the at least one external connection point connects to an external cable.

10. A flip-chip structure according to claim 9, wherein:
the external cable in a ribbon cable.

11. A flip-chip structure according to claim 8, wherein:
the at least one connection point is connected via external conductors to at least one external connection point of another preformed planar structure.

12. A flip-chip structure, according to claim 1, wherein:
a given conductive element extends transversely across an intermediate portion of the preformed planar structure so as to have a one end extending into a one through hole and an other end extending into an other through hole.

13. A flip-chip structure, comprising:
a chip having first solder balls on a face thereof;
a substrate having corresponding second solder balls on a face thereof;
a separate and distinct preformed planar structure disposed between the chip and the substrate, having two opposite faces, one face in contact with the chip and the opposite face in contact with the substrate;
through holes extending through the preformed planar structure from the one face to the opposite face;
at least one conductive element embedded midway between the one face and the opposite face of the preformed planar structure and extending fully across at least one corresponding through hole, each conductive element dividing a corresponding through hole into a first through hole portion extending from the one face of the preformed planar structure to the conductive element and a second through hole portion extending from the opposite face of the preformed planar structure to the conductive element; and
at least one solder joint consisting essentially of at least one first solder ball contacting a one surface of the conductive element and a second solder ball contacting an other, opposite surface of the conductive element, thereby forming an electrical path from the first solder ball to the conductive element and from the conductive element to the second solder ball.

14. A flip-chip structure according to claim 13, wherein:
for a given through hole divided by a conductive element, the first through hole portion is coaxially aligned with the second through hole portion; and
a portion of the through holes are angled such that openings of said angled through holes on the one face of the preformed planar structure occur at points not directly opposite corresponding openings on the opposite face of the preformed planar structure.

15. A flip-chip structure, according to claim 13, wherein:
a given conductive element extends transversely across an intermediate portion of the preformed planar structure so as to have a one end extending into a one through hole and an other end extending into an other through hole.

16. An interconnection structure for interposition between a chip and a substrate comprising:
a preformed planar structure having two opposite faces, one face contacting a chip and an other face contacting a substrate;
holes extending completely through the preformed planar structure from the one face to the other face, said holes having a first portion extending from the one face of the structure to an intermediate portion of the structure, and having a second portion extending from the other face of the structure to the intermediate portion of the structure, an intermediate portion of the holes being located between said first and second portions of the holes;
conductive fingers disposed within the structure and extending across the intermediate portions of the holes so as to electrically contact first solder balls extending into the through holes from the chip and to electrically contact second solder balls extending into the through holes from the substrate.

17. A flip-chip structure according to claim 16, further comprising:
external connection points on the preformed planar structure, connected within the preformed planar structure, to the conductive fingers.

18. A flip-chip structure according to claim 17, wherein:
the at least one external connection point connects to an external cable.

19. A flip-chip structure according to claim 18, wherein:
the external cable is a ribbon cable.

20. A flip-chip structure according to claim 17, wherein:
the at least one connection point is connected via external conductors to at least one external connection point of another preformed planar structure.

* * * * *